(12) United States Patent
Kruger

(10) Patent No.: US 11,237,291 B2
(45) Date of Patent: Feb. 1, 2022

(54) CAPACITIVE SENSOR

(71) Applicant: George Axel Kruger, Middle Park (AU)

(72) Inventor: George Axel Kruger, Middle Park (AU)

(*) Notice: Subject to any disclaimer, the term of this patent is extended or adjusted under 35 U.S.C. 154(b) by 13 days.

(21) Appl. No.: 16/704,774

(22) Filed: Dec. 5, 2019

(65) Prior Publication Data

US 2020/0200936 A1     Jun. 25, 2020

Related U.S. Application Data

(60) Provisional application No. 62/942,826, filed on Dec. 3, 2019, provisional application No. 62/775,931, filed on Dec. 6, 2018.

(51) Int. Cl.
*G01V 3/08*     (2006.01)
*G01N 27/22*     (2006.01)

(52) U.S. Cl.
CPC ........... *G01V 3/088* (2013.01); *G01N 27/221* (2013.01)

(58) Field of Classification Search
None
See application file for complete search history.

(56) References Cited

U.S. PATENT DOCUMENTS

| | | | |
|---|---|---|---|
| 6,847,354 B2 | 1/2005 | Vranish | |
| 2010/0259283 A1* | 10/2010 | Togura | H03K 17/955 324/679 |
| 2012/0050203 A1 | 3/2012 | Osoinach et al. | |
| 2012/0229417 A1 | 9/2012 | Badaye | |
| 2015/0091849 A1 | 4/2015 | Ludden | |
| 2016/0170531 A1 | 6/2016 | Lee | |

OTHER PUBLICATIONS

AN85951, "PSoC® 4 and PSoC Analog Coprocessor CapSense Design Guide", Doc. No. 001-85951 Rev. *Q, Cypress Semiconductor 198 Champion Court San Jose, CA 95134-1709. Revision *Q of Nov. 18, 2016 (given in the bottom row of table "revision history" on p. 159). Available on https://www.cypress.com/file/348426/ download. Downloaded on Jan. 31, 2020. Whole document, especially abstract, chapters 2 and 3, Figs. 2.2-2.9, 2.15, 2.17, 2.20, 2.27.
International Search Report and Written Opinion of the International Searching Authority for Application No. PCT/AU2019/051339 dated Feb. 6, 2020 (10 pages).

* cited by examiner

*Primary Examiner* — Jas A Sanghera
(74) *Attorney, Agent, or Firm* — Dicke, Billig & Czaja, PLLC

(57) ABSTRACT

A capacitive sensor system for detecting an object. The capacitive sensing system includes a capacitive sensing pad, a conductive discriminating pad, a switch, a capacitance measurement circuit and a controller. The conductive discriminating pad is in proximity to the capacitive sensing pad. The switch includes an input terminal coupled to the discriminating pad. The switch selectively couples the discriminating pad to a voltage potential of the capacitive sensing pad or to a ground potential. The capacitance measurement circuit detects a capacitance value of the capacitive sensing pad. The controller is operable to measure the capacitance value of the capacitive sensing pad when the discriminating pad is coupled to the capacitive sensing pad voltage potential or to the ground potential.

14 Claims, 21 Drawing Sheets

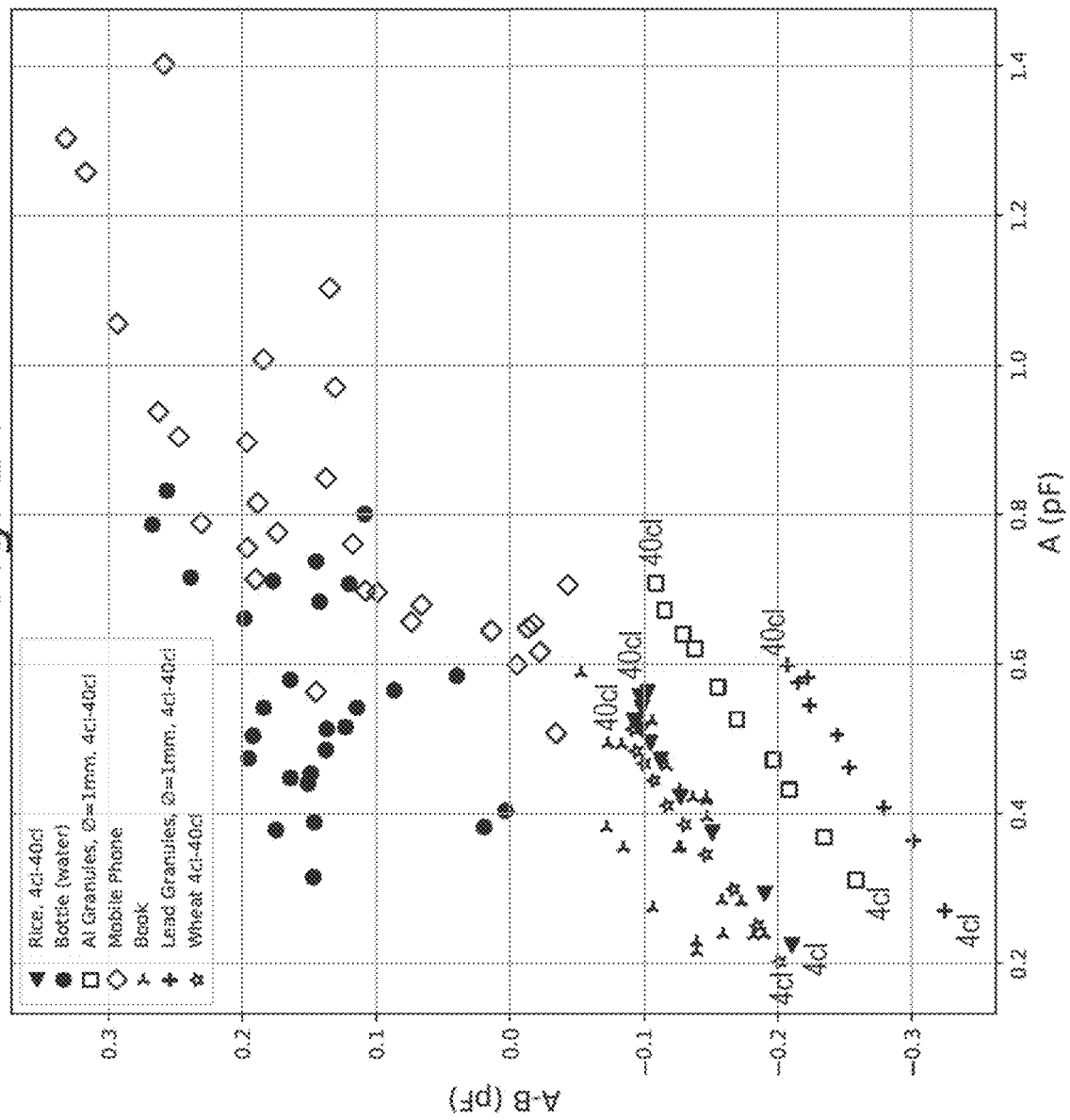

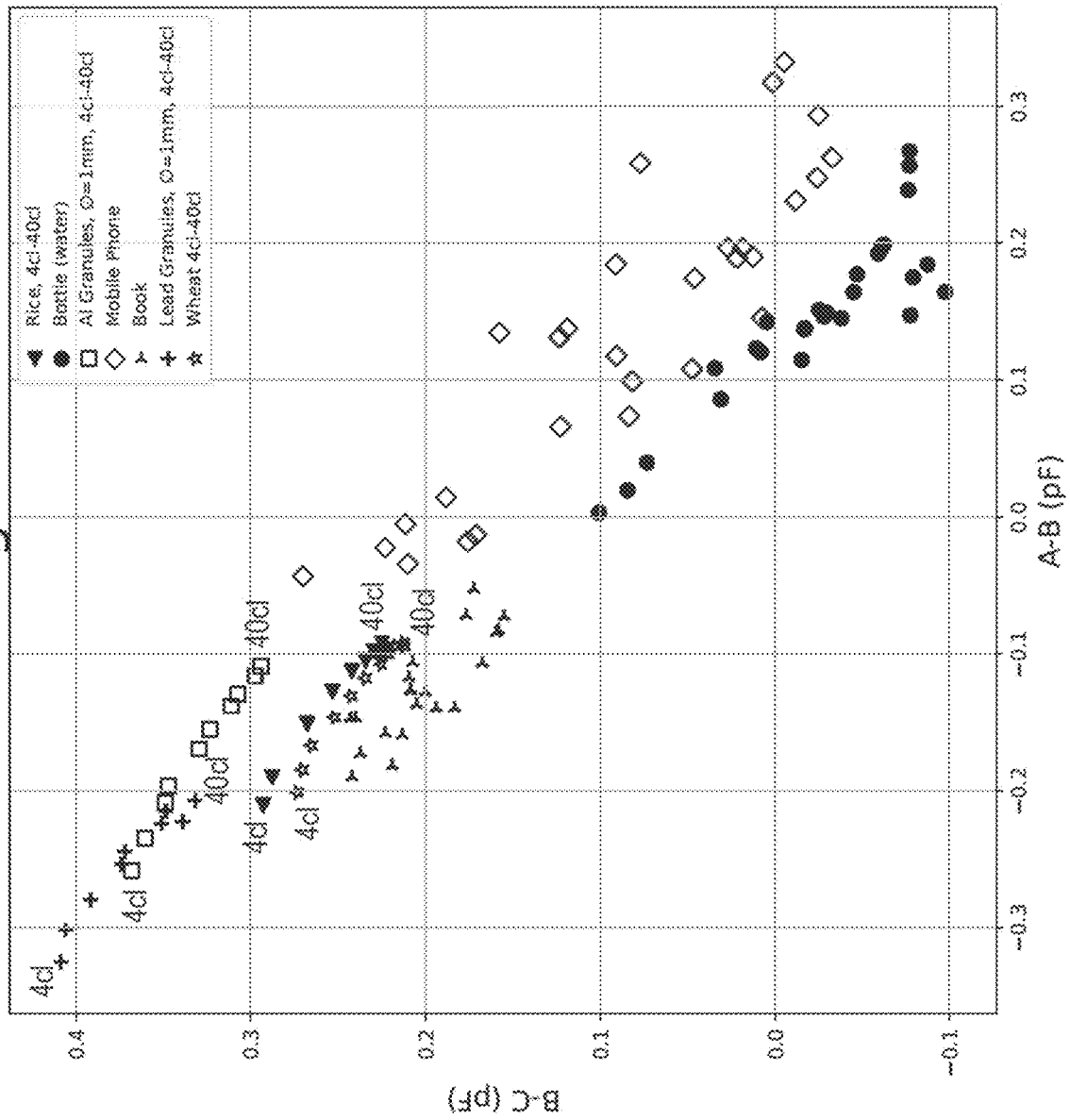

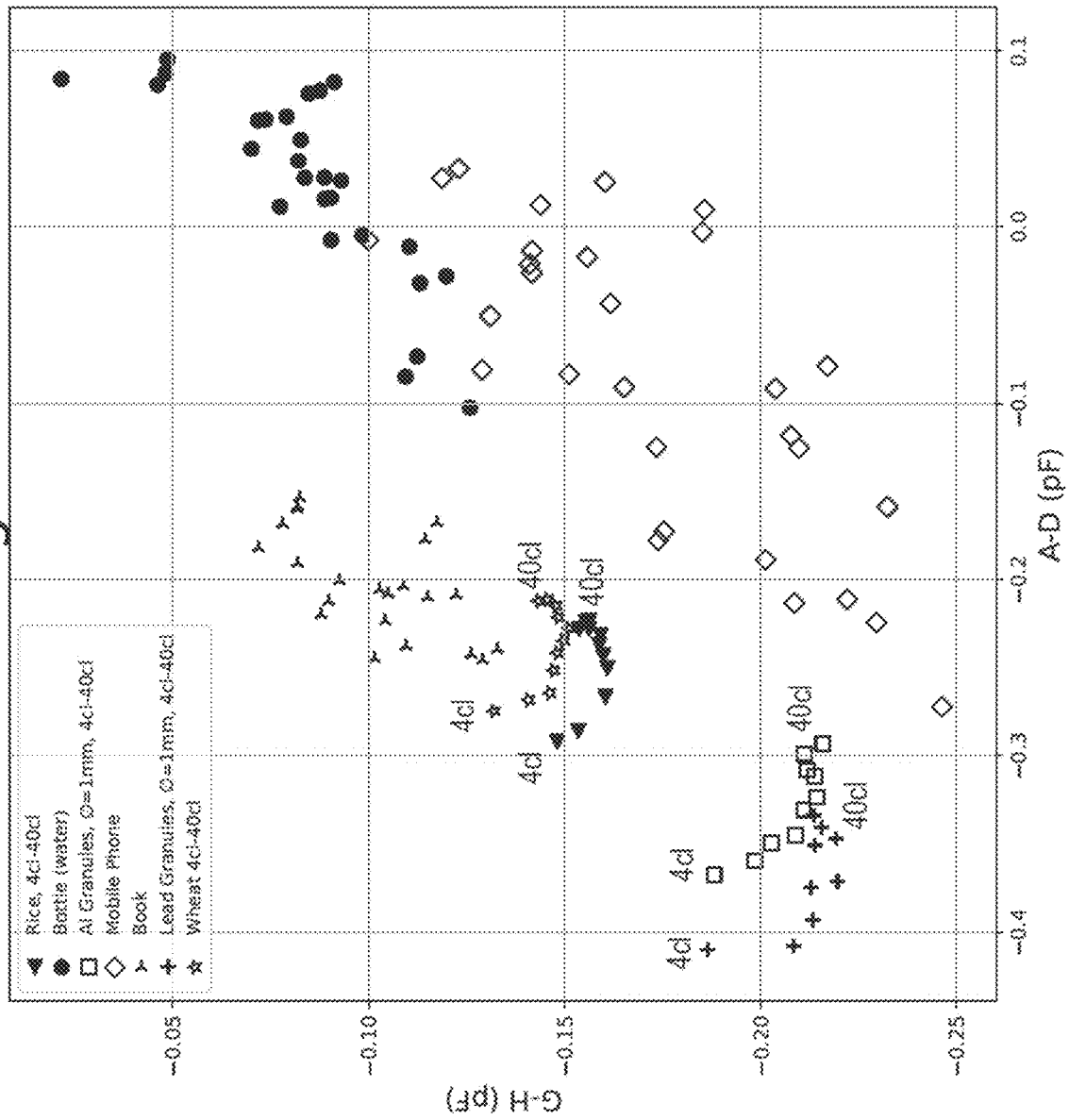

CAPACITIVE SENSOR

CROSS-REFERENCE TO RELATED APPLICATION

This application is a non-provisional of U.S. application Ser. No. 62/775,931 filed Dec. 6, 2018, and U.S. application Ser. No. 62/942,826 filed Dec. 3, 2019, which are both herein incorporated by reference.

FIELD OF TECHNOLOGY

The present application relates to a capacitive proximity sensor, in particular, capacitive sensors for proximity sensing and discrimination.

BACKGROUND

Existing capacitive sensors have no or limited ability to distinguish between different types of objects or substances.

For these and other reasons, there is a need for the present invention.

SUMMARY

According to an embodiment of a capacitive sensing system for detecting an object, the capacitive sensing system includes a capacitive sensing pad, a conductive discriminating pad, a switch, a capacitance measurement circuit and a controller. The conductive discriminating pad is in proximity to the capacitive sensing pad. The switch includes an input terminal coupled to the discriminating pad. The switch selectively couples the discriminating pad to a voltage potential of the capacitive sensing pad or to a ground potential. The capacitance measurement circuit detects a capacitance value of the capacitive sensing pad. The controller is operable to measure the capacitance value of the capacitive sensing pad when the discriminating pad is coupled to the capacitive sensing pad voltage potential or to the ground potential. The capacitive measurements taken provide data about the properties of the object. This data can be used to identify, and/or distinguish between, different objects, materials or liquids.

According to a method of identifying an object or substance, the method includes providing a capacitive sensing pad and n conductive discriminating pads where n≥1, providing a shield driver that provides a voltage potential of the capacitive sensing pad, and providing n switches that each have an input terminal coupled to one of the n discriminating pads and have two switch connection states which selectively couple the input terminal to the capacitive sensing pad voltage potential or to the ground potential, wherein the n switches are operable to provide $2^n$ unique connection states for the n discriminating pads. The method includes placing the object in proximity to the capacitive sensing pad. The method includes measuring up to $2^n$ capacitance values of the capacitive sensing pad that each correspond to one of the $2^n$ unique connection states for the n discriminating pads. The method includes determining a capacitance value for the object or substance by comparing a first set of the $2^n$ capacitance values and a second set of the $2^n$ capacitance values. The method includes identifying the object or substance by comparing the capacitance value to one or more reference capacitance values for reference objects or substances having the same and/or different material properties as the object or sub stance.

According to an embodiment of a method of identifying an object or substance, the method includes providing a capacitive sensing pad and n conductive discriminating pads where n≥1, providing a shield driver that provides a voltage potential of the capacitive sensing pad, and providing n switches that each have an input terminal coupled to one of the n discriminating pads and have two switch connection states which selectively couple the input terminal to the capacitive sensing pad voltage potential or to the ground potential, where the n switches are operable to provide $2^n$ unique connection states for the n discriminating pads. The method includes placing the object or substance in proximity to the capacitive sensing pad. The method includes taking capacitive measurement sets of the object or substance, where each measurement set corresponds to $2^n$ capacitance values measured using the capacitive sensing pad for the $2^n$ unique connection states for the n discriminating pads. The method includes determining a mathematical relationship between the capacitive measurement sets and known dielectric constants or dipole moments of the object or substance. The method includes identifying the object or substance based on the mathematical relationship and the known dielectric constants or dipole moments of the object or substance.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 14 illustrates plots of embodiments of capacitive measurements for a variety of objects and substances;

FIG. 17 illustrates plots of embodiments of capacitive measurements for a variety of objects and substances;

FIG. 21 illustrates plots of embodiments of capacitive measurements for a variety of objects and substances.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Figure 1:
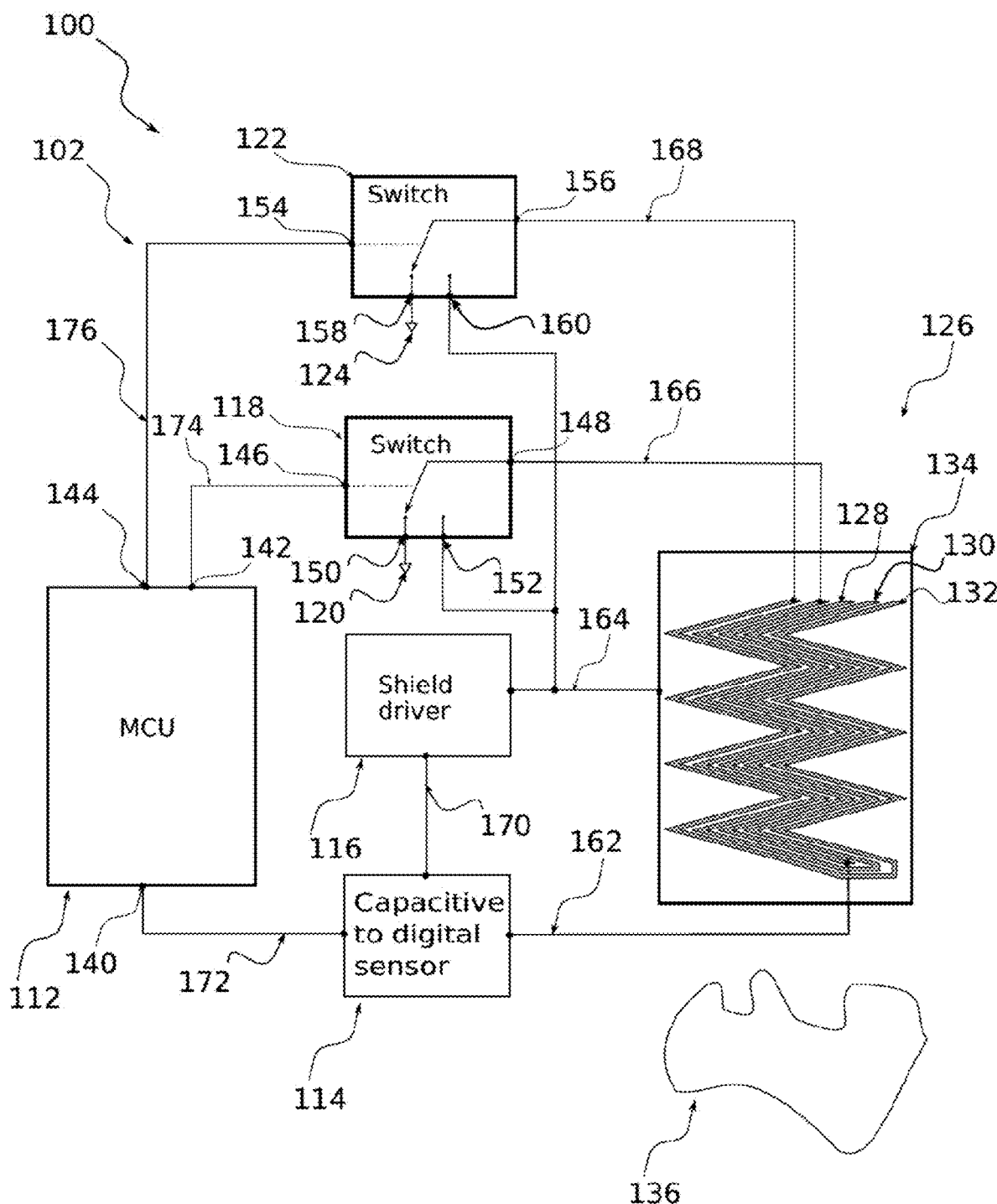
FIG. 1 illustrates an embodiment of a system which includes a sensor measurement system and a sensing pad unit.

FIG. 1 illustrates an embodiment of a system 100 which includes a sensor measurement system 102 and a sensing pad unit 126. Sensor measurement system 102 includes a control unit 112, a capacitive to digital sensor 114, a shield driver 116, a single-pole double-throw switch 118 and a second single-pole double-throw switch 122. Sensing pad unit 126 includes a capacitive sensing pad 128, a proximate discriminating pad 130, a second proximate discriminating pad 132 and a shield 134. A proximate object or substance 136 is illustrated in proximity to t sensing pad unit 126. The capacitive to digital sensor 114 is connected via conductive line 162 to the capacitive sensing pad 128, and is connected via conductive line 170 to the input of the shield driver 116. The inputs 146 and 154 of the respective switches 118 and 122 are controlled by the control unit 112. The output of the shield driver 116 is connected to the shield pad 134 via conductive line 164.

In the illustrated embodiment, control unit 112 is a micro-controller or micro-controller unit (MCU). In different embodiments, the control unit 112 and the capacitive to digital sensor 114 may be separate integrated circuit chips or they may be incorporated into the same integrated circuit chip. Furthermore, in different embodiments, shield driver 116 and the capacitive to digital sensor 114 may be separate integrated circuit chips or they may be incorporated into the same integrated circuit chip.

The control unit 112 uses methods of digital interfacing to control the functioning of the capacitive to digital sensor 114. If the control unit 112 and the capacitive to digital sensor 114 are separate physical chips then these interface methods can include, but are not limited to, $I^2C$ (also known as Inter-Integrated Circuit) and SPI (also known as Serial Peripheral Interface). In the illustrated embodiment, capacitive to digital sensor 114 is coupled to communication interface 140 via multiwire conductive lines 172. The connection to communication interface 140 can be $I^2C$ (2 wire), SPI (4 wire) or can be another suitable type of connection.

In the illustrated embodiment, the capacitance sensing pad 128, the discriminating pads 130 and 132, and shield pad 134, are constructed of conductive materials such as metals. By way of example, this can include a printed circuit board, a flex-PCB, copper tape, or conductive cloth, but can also be any other conductive substance.

In the illustrated embodiment, shield driver 116 is electrically connected to shield pad 134 via conductive line 164, and shield driver 116 drives shield pad 134 to the same voltage potential as capacitive sensing pad 128. Therefore, there is no electric field between the capacitive sensing pad 128 and the shield pad 134. Consequently, any capacitive effect of a material behind the shield pad 134 on a capacitance measurement by capacitance to digital sensor 114 is nullified. In usage, the shield pad 134 is used to provide directional sensitivity to the capacitive sensing pad 128 and to limit the capacitive effects of material behind the shield pad 134. In the illustrated embodiment, the shield pad 134 is placed in close proximity to the capacitive sensing pad 128, typically a distance of a few tenths of a millimeter up to a few millimeters. In other embodiments, other suitable spacing can be used.

In various embodiments, shield pad 134 may have a separate physical construction than the capacitive sensing pad 128 and the discriminating pads 130 and 132, or shield pad 134 can be within the substrate of capacitive sensing pad 128, and discriminating pads 130 and 132, such as with a multilayer printed circuit board.

The size and shape of the capacitive sensing pad 128 and the discriminating pads 130 and 132 will depend on the particular application. For example, if it is necessary that the capacitive sensing pad 128 be sensitive to distant objects such as a proximate object or substance 136 that is spaced apart from capacitive sensing pad 128 by a large distance, then the capacitive sensing pad 128 should be larger than a capacitive sensing pad 128 designed for sensitivity to closer objects such as a proximate object or substance 136 that is spaced apart from capacitive sensing pad 128 by a distance that is less than the large distance.

In the illustrated embodiment, with regard to the switches 118 and 122, switches 118 and 122 may be a solid state type switch. In the illustrated embodiment, switches 118 and 122 are controlled via a digital interface from control unit 112, and this interface can be an Input/Output (I/O) line set to either a digital high (H) or a digital low (L). In other embodiments, other suitable ways to control switches 118 and 122 may be used.

In the illustrated embodiment, the input terminal 146 of the first switch 118 is electrically connected to I/O terminal 142 of the control unit 112 via conductive line 174. The common node 148 of the first switch 118 is electrically connected to the first discriminating pad 130 via conductive line 166. One output terminal 150 of the first switch 118 is connected to a ground potential at 120, and the other output terminal 152 is connected to the output of the shield driver 116 via conductive line 164. The input terminal 154 of the second switch 122 is electrically connected to I/O terminal 144 of the control unit 112 via conductive line 176. The common node 156 of the switch 122 is connected to the second discriminating pad 132 via conductive line 168. One output terminal 158 of the switch 122 is connected to a ground potential at 124, the other output terminal 160 is connected to the output of the shield driver 116 via conductive line 164.

The switches 118 and 122 are controlled by control unit 112 and control unit 112 can set the input terminals 146 and 154 of respective switches 118 and 122 to the appropriate value of H or L. It is understood that the specifics of this will depend on the chosen implementation of the switches 118 and 122, and that the order of the switching is not important to the method.

If we write in shorthand {X,Y} where X and Y represent the connection state of the first switch 118 and the second switch 122 respectively, where the connection state can take the values of either "S" or "G" which representing the state when the first switch 118 or the second switch 122 connects respectively the first discriminating pad 130 or the second discriminating pad 132 to either the output of the shield driver 116 via conductive line 164 ("S"), or to respective ground connections 120 and 124 ("G"). Then the possible measurement configurations can be written as: measurement A: {S, S}; measurement B: {G, G}; measurement C: {S, G}; measurement D: {G, S}. At the end of a single measurement cycle, there will be 4 capacitive measurements corresponding to all possible configurations of the discriminating pad connections. The capacitive measurements at the end of the single measurement cycle will be hereafter referred to as a "measurement set" (e.g., capacitive measurement set (A,B,C,D)).

In the illustrated embodiment, switching discriminating pads 130 and 132 between respective ground connections 120 and 124 and the output of shield driver 116 via conductive line 164 results in a change in the electric field lines between the capacitive sensing pad 128 and the proximate object 136, resulting in 4 different capacitive measurements. The degree to which these measurements change will also be dependent on the type of substance or object, its shape, and its distance from the sensing pad unit. Consequently, these measurements may be used to distinguish between and/or identify different objects or substances 136, or may be used to determine the properties of the object or substance 136.

In the illustrated embodiment, to determine the relationship between the proximate object 136 and the capacitive measurements, a set of sample measurements for each of a range of objects and substances that are of interest are taken and the sample set of measurement sets analyzed using data analysis techniques. In the illustrated embodiment, the application of one or more methods of Machine Learning or numerical optimization can be used. These methods include, but are not limited to, Neural Networks, Decision Trees and its variants, Nearest Neighbor algorithms, or Linear Discriminant Analysis, evolutionary search, genetic algorithms, high dimensional splines, and linear and non-linear optimization. In other embodiments, visual inspection of the set of sample measurements can be used.

As there may be a non-negligible background capacitance that exists even when there is no proximate object 136, for example due to parasitic capacitance in the sensing pad unit 126, or to the capacitive effects of the physical installation of the sensor system 100, it may be necessary to perform a baseline measurement of this background capacitance for each configuration of the discriminating pads, and then use these values to remove the background reading from further measurements. Consequently there will be 4 baseline values. These baseline values correspond to measurement configurations which are: measurement A: {S, S}; measurement B: {G, G}; measurement C: {S, G}; measurement D: {G, S}. Typical methods of establishing a baseline are to compute the mean or the median of a set of measurements taken in the absence of a proximate object.

Figure 2:
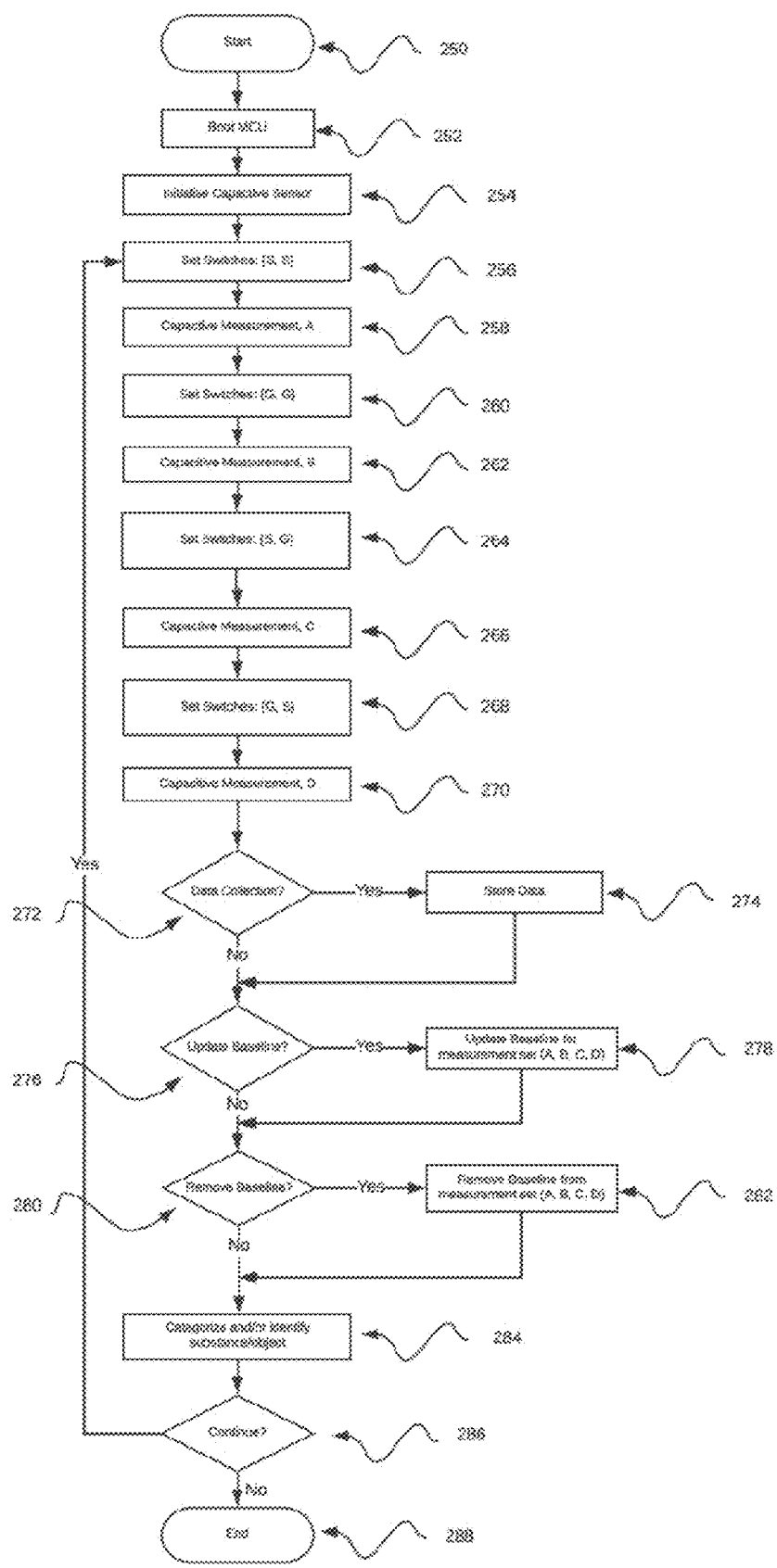
FIG. 2 illustrates a flow chart of an embodiment of a measurement process.

FIG. 2 illustrates a flow chart of an embodiment of a measurement process. On startup 250, the control unit 112 performs its initialization process 252. The capacitive to digital sensor 114 performs its initialization process 254 with the measurement parameters set by the control unit 112. These parameters are specific to each capacitive sensor but may include parameters like measurement rate, channel number, method of offset, and accuracy. The first switch 118 and the second switch 122 are set to state {S,S} at 256. A capacitive measurement, A, is made at 258. The first switch 118 and the second switch 122 are set to state {G,G} at 260. A second capacitive measurement, B, is made 262. The first switch 118 and the second switch 122 are set to state {S,G} at 264. A third capacitive measurement, C, is made at 266. The first switch 118 and the second switch 122 are set to state {G,S} at 268. A fourth capacitive measurement, D, is made at 270.

If these measurement are part of a data collection process at 272, such as to be used as sample data for a Machine Learning analysis, then the data is stored at 274 for later transfer to a memory device.

If these measurements are part of a baseline process at 276, then the baseline is calculated and updated at 278. If the baseline is to be removed from the measurement at 280, then the baseline is removed at 282. If categorization or identification of the object or material is required, or if the computation of material properties is required, then the categorization/computational process is implemented at 284. If the process continues at 286, then the process returns to the switch process settings at 256, otherwise the process halts at 288.

Figure 3A:
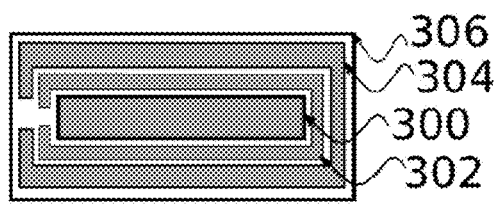
FIGS. 3A-3H illustrate top views of embodiments of a sensing pad unit.

FIGS. 3A-3H illustrate plan or top views of embodiments of a sensing pad unit. FIG. 3A illustrates a plan view of a symmetrical arrangement, comprising a substantially rectangular capacitive sensing pad 300, a first discriminating pad 302 substantially surrounding the capacitive sensing pad 300, a second discriminating pad 304 substantially surrounding the capacitive sensing pad 300 and the first discriminating pad 302, and a shield pad 306 underneath the capacitive sensing pad 300, first discriminating pad 302 and second discriminating pad 304. In the illustrated embodiment, shield pad 306, underneath the capacitive sensing pad 300, reduces the sensitivity of capacitance measurements made using the capacitive sensing pad 300 to capacitance effects caused by material behind the shield pad 306.

Figure 3B:
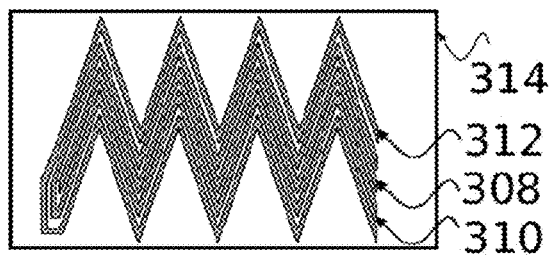

FIG. 3B illustrates a plan view of a symmetrical arrangement, comprising a polyline of line segments forming a "W" shape that includes a capacitive sensing pad 308 that includes eight line segments, a first discriminating pad 310 that includes 18 line segments and substantially surrounding the capacitive pad 308, a second discriminating pad 312 that includes 18 line segments and substantially surrounds the capacitive sensing pad 308 and the first discriminating pad 310, and a shield pad 314 underneath the capacitive sensing pad 308, first discriminating pad 310 and second discriminating pad 312. In other embodiments, capacitive sensing pad 308 may include of any suitable number of connected line segments or curves.

Figure 3C:
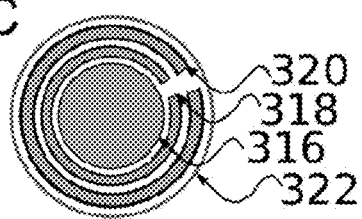

FIG. 3C illustrates a plan view of a symmetrical arrangement, comprising a disc shaped capacitive sensing pad 316, a first discriminating pad 318 substantially surrounding the capacitive pad 316, a second discriminating pad 320 substantially surrounding the capacitive sensing pad 316 and the first discriminating pad 318, and a shield pad 322 underneath the capacitive sensing pad 316, first discriminating pad 318 and second discriminating pad 320.

Figure 3D:
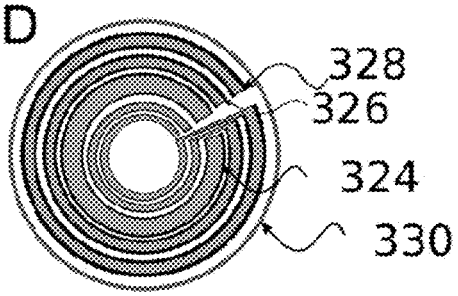

FIG. 3D illustrates a plan view of a symmetrical arrangement, comprising an arc capacitive sensing pad 324, a first discriminating pad 326 substantially surrounding the capacitive sensing pad 324, a second discriminating pad 328 substantially surrounding the capacitive sensing pad 324 and the first discriminating pad 326, and a shield pad 330 underneath the capacitive sensing pad 324, first discriminating pad 326 and second discriminating pad 328.

Figure 3E:
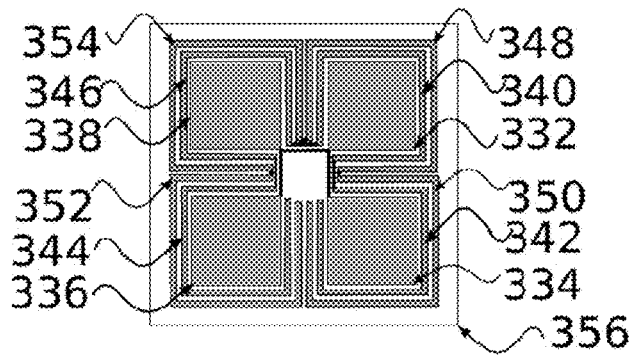

FIG. 3E illustrates a plan view of a grid of four substantially square capacitive sensing pads 332, 334, 336 and 338, each substantially surrounded by a respective inner discriminating pad 340, 342, 344 and 346, and a respective outer discriminating pad 348, 350, 352 and 354, and a shield pad 356 underneath the capacitive sensing pads 332, 334, 336 and 338, the inner discriminating pads 340, 342, 344 and 346 and the outer discriminating pads 348, 350, 352 and 354. The capacitive sensing pad 332 and its surrounding discriminating pads 340 and 348 comprise a first sub unit. The capacitive sensing pad 334 and its surrounding discriminating pads 342 and 350 comprise a second sub unit. The capacitive sensing pad 336 and its surrounding discriminating pads 344 and 352 comprise a third sub unit. The capacitive sensing pad 338 and its surrounding discriminating pads 346 and 354 comprise a fourth sub unit. The grid spacing is tightly packed, whereby the spacing between the individual sub units is less than the size of the sub unit.

Figure 3F:
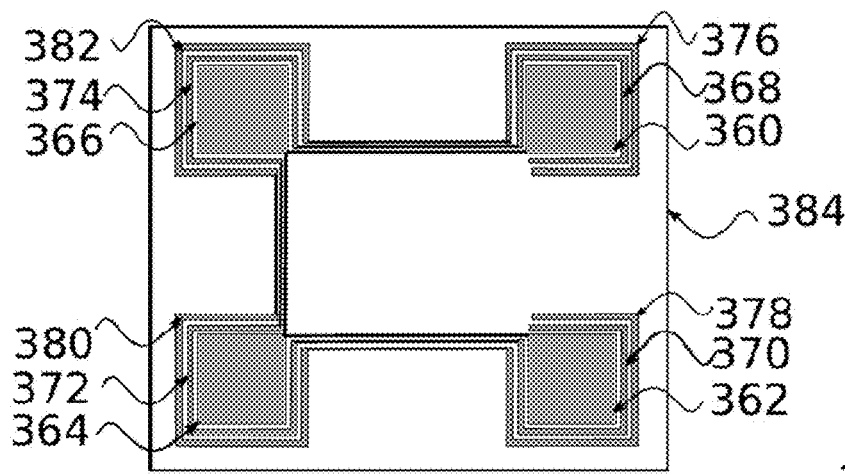

FIG. 3F illustrates a plan view of a grid of four substantially square capacitive sensing pads 360, 362, 364 and 366, each substantially surrounded by a respective inner discriminating pad 368, 370, 372 and 374, and a respective outer discriminating pad 376, 378, 380 and 382, and a shield pad 384 underneath the capacitive sensing pads 360, 362, 364 and 366, the inner discriminating pads 368, 370, 372 and 374 and the outer discriminating pads 376, 378, 380 and 382. The grid of capacitive sensing pads 60, 362, 364 and 366, are electrically connected together. The grid of inner discriminating pads 368, 370, 372 and 374 are electrically connected together. The grid of outer discriminating pads 376, 378, 380 and 382 are electrically connected together. The capacitive sensing pad 360 and its surrounding discriminating pads 368 and 376 comprise a first sub unit. The capacitive sensing pad 362 and its surrounding discriminating pads 370 and 378 comprise a second sub unit. The capacitive sensing pad 364 and its surrounding discriminating pads 372 and 380 comprise a third sub unit. The capacitive sensing pad 366 and its surrounding discriminating pads 374 and 382 comprise a fourth sub unit. The grid spacing is sparsely packed, whereby the spacing between the individual sub units is greater than the size of the sub units.

In various embodiments, any size or number of grid array sub units can be constructed and the sensing pad units illustrated in FIG. 3E and FIG. 3F are specific embodiments of 2 by 2 grids of square sensing pad units.

Figure 3G:
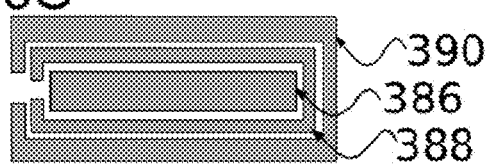

FIG. 3G illustrates a plan view of a symmetrical arrangement, comprising a substantially rectangular capacitive sensing pad 386, a first discriminating pad 388 substantially surrounding the capacitive sensing pad 386, a second discriminating pad 390 substantially surrounding the capacitive sensing pad 386 and the first discriminating pad 388. There is no shield pad in this embodiment. In the embodiments illustrated in FIGS. 3A-3H, the sensing pad unit can be constructed with or without a shield pad.

Figure 3H:
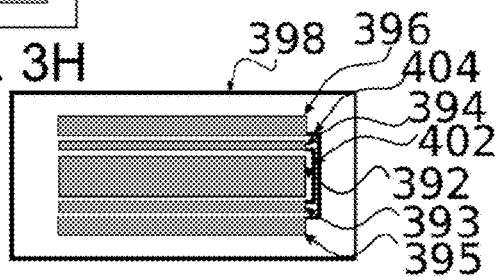

FIG. 3H illustrates a plan view of a symmetrical arrangement, comprising a substantially rectangular capacitive sensing pad 392, a first inner discriminating pad 393, a second inner discriminating pad 394 electrically connected to the first inner discriminating pad 393 via a conductive line 402, a first outer discriminating pad 395, a second outer discriminating pad 396 electrically connected to the first outer discriminating pad 395 via a conductive line 404, and a shield pad 398 underneath the capacitive sensing pad 392, the first inner discriminating pad 393, the second inner discriminating pad 394, the first outer discriminating pad 395 and the second outer discriminating pad 396. In various embodiments, any discriminating pad may comprise multiple line or curve segments which may be physically separated, but which are electrically joined together via conductive lines or traces to comprise a single discriminating pad unit.

In various embodiments of sensing pad units illustrated in FIGS. 3A-3H, the shield pad has a size and shape that is equal to or greater than the capacitive sensing pad, and may be large in extent or area so as to include or be underneath the outermost discriminating pad. In various embodiments of sensing pad units, the separation between the capacitive sensing pad and the shield pad should be less than the smallest dimension of the capacitive sensing pad. For example, in FIG. 3A the separation between the capacitive sensing pad 300 and the shield pad 306 should be less than the width of the capacitive sensing pad 300. In various embodiments, the minimum dimension can be a length or width when the capacitive sensing pad has a rectangular shape or can be a diameter when the capacitive sensing pad has a disc or circular shape.

Referring now to FIG. 1, in embodiments of sensing pad unit 126, the shield pad may be dispensed with and not used if a substantially symmetrical sensitivity, both forward and behind the capacitive sensing pad 328 is desired.

In the embodiments illustrated in FIG. 1 and FIGS. 3A-3H, a capacitive sensing pad and n conductive discriminating pads where $n \geq 1$ can be used. These embodiments include a shield driver that provides a voltage potential of the capacitive sensing pad and n switches that each have an input terminal coupled to one of the n discriminating pads and have two switch connection states which selectively couple the input terminal to the capacitive sensing pad voltage potential or to the ground potential. In these embodiments, the n switches are operable to provide up to $2^n$ unique connection states for the n discriminating pads. FIG. 1 illustrates an embodiment where there are n conductive discriminating pads and n=2. The two discriminating pads are illustrated at 130 and 132. FIG. 1 further illustrates that for n switches where n=2, the two switches are switch 118 and switch 122.

Referring to FIGS. 3A-3H, it is understood that the number of discriminating pads can be any suitable number n, where $n \geq 1$, and that the diagrams in FIG. 3A-3H illustrate a specific instance of sensing pad units where n=2. Furthermore, the geometric configuration of the pads, e.g. Size, shape, and spatial relationship, will depend upon design purpose of the sensor system, and on the shape and spatial orientation of the objects or substances being interrogated, and upon the space and shape exigencies of the specific physical implementation. The configurations shown in FIGS. 3A-3H illustrate embodiments of sensing pad units for a number of applications or uses. For example, for use as a seat occupancy sensor, a sensing pad unit for the form of FIG. 3B or FIG. 3F may be found suitable. For use as a level sensor, a sensing pad of the form of FIG. 3H may be suitable. For use as an immersion sensor within a liquid to measure properties of the liquid, a sensing pad of the form of FIG. 3A, FIG. 3G or FIG. 3H may be suitable. For use in object identification for applications such as robotic gripping units, a sensing pad unit of the form in FIG. 3C, FIG. 3D or FIG. 3E may be suitable. In other embodiments, other suitable physical implementations of sensing pad units may be used.

In various embodiments of switching n switches where each switch connects a corresponding discriminating pad between a ground and a shield potential, the n switches will result in a total of $2^n$ unique combinations of switching states and therefore $2^n$ capacitive measurements. When n=2, the number of measurements can be 4. If n=3, the number of measurements can be 8. The $2^n$ capacitive measurements are referred to herein as a measurement set.

It is understood that the user may choose not to set all possible switch state combinations and that the $2^n$ unique states is an upper limit on the number of unique measurements. For example, if n=3, the number of unique measurements may be less than 8, and can be any suitable number of unique measurements such as 7 or 6.

Figure 4:
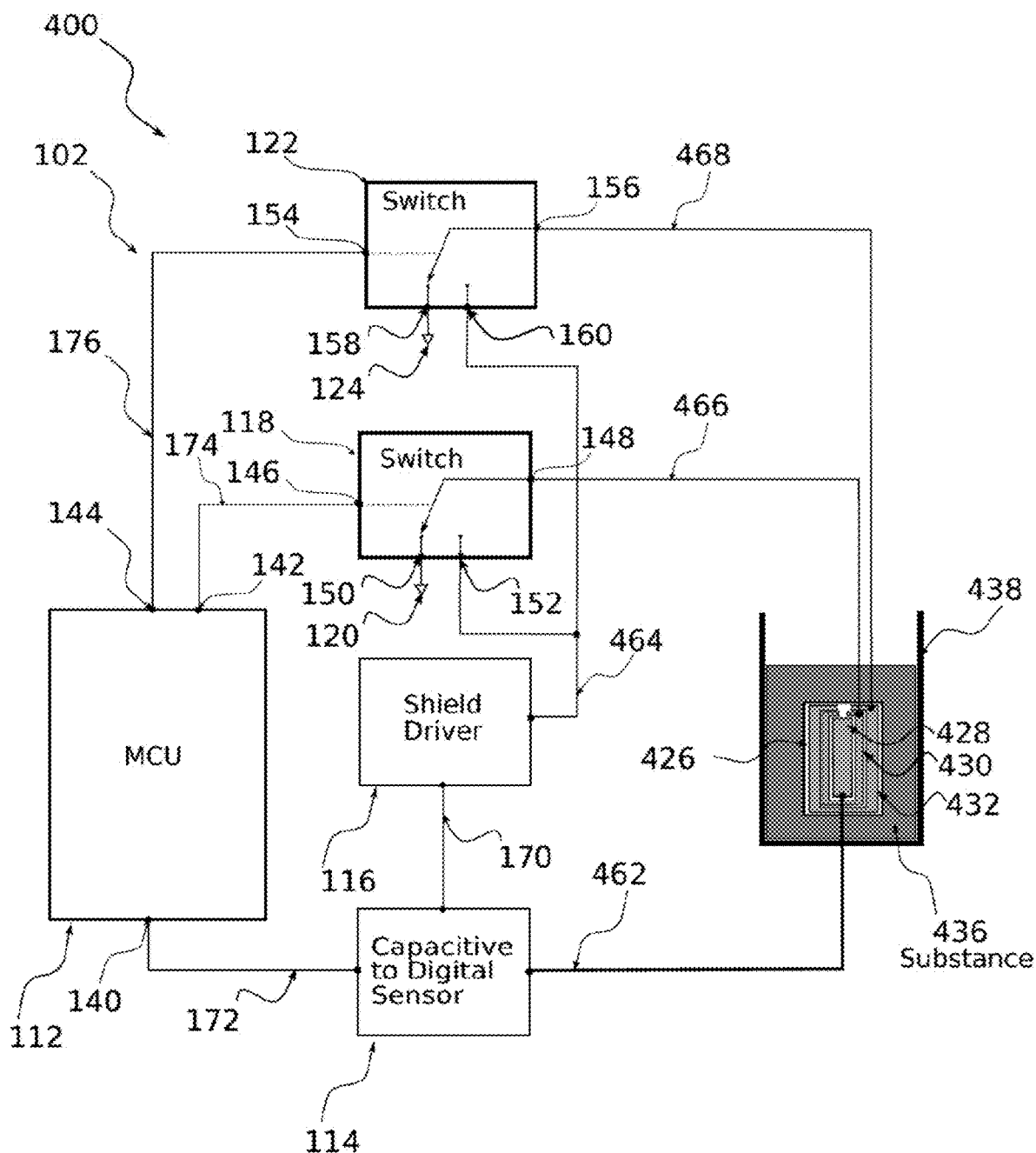
FIG. 4 illustrates an embodiment of a system which includes a sensor measurement system and a sensing pad unit.

FIG. 4 illustrates an embodiment of a system 400 which includes a sensor measurement system 102 and a sensing pad unit 426. The sensor measurement system 102 is described with respect to FIG. 1. In the illustrated embodiment, a substance 436 is placed inside a container 438. The sensing pad unit 426 is immersed in the substance 436. In various embodiments, the substance can be a liquid or can be a granular material.

The capacitive to digital sensor 114 is connected via conductive line 462 to the capacitive sensing pad 428, and is connected via conductive line 170 to the input of the shield driver 116. The inputs 146 and 154 of the respective switches 118 and 122 are controlled by the control unit 112.

In the illustrated embodiment, the capacitance sensing pad 428 and the discriminating pads 430 and 432, are constructed of conductive materials such as metals. By way of example, this can include a printed circuit board, a flex-PCB, copper tape, or conductive cloth, but can also be any other conductive substance. The size and shape of the capacitive sensing pad 428 and the discriminating pads 430 and 432 will depend on the particular application and geometry as discussed herein. In other embodiments, a shield pad as discussed herein can be used.

The input terminal 146 of the first switch 118 is electrically connected to I/O terminal 142 of the control unit 112 via conductive line 174 the common node 148 of the first switch 118 is electrically connected to the first discriminating pad 430 via conductive line 466. One output terminal 150 of the first switch 118 is connected to a ground potential at 120, and the other output terminal 152 is connected to the output of the shield driver 116 via conductive line 464.

The input terminal 154 of the second switch 122 is connected to I/O terminal 144 of the control unit 112 via conductive line 176. The common node 156 of the switch 122 is connected to the second discriminating pad 432 via conductive line 468. One output terminal 158 of the switch 122 is connected to a ground potential at 124, the other output terminal 160 is connected to the output of the shield driver 116 via conductive line 464.

The switches 118 and 122 are controlled by the control unit 112 such that when the user wants to make a measurement with the capacitive sensing pad 428 when one or both of the discriminating pads 430 and 432 are connected to the ground potential respectively at 120 and/or 124 or to the output of the shield driver 116 via conductive line 464, the control unit 112 will set the input terminals 146 and 154 of respective switches 118 and 122 to the appropriate value, either H or L. It is understood that the specifics of this will depend on the chosen implementation of the switches 118 and 122, and that the order of the switching is not important to the method.

If we write in shorthand {X,Y} where X and Y represent the connection state of the first switch 118 and the second switch 122 respectively, where the connection state can take the values of either "S" or "G" which representing the state when the first switch 118 or the second switch 122 connects respectively the first discriminating pad 430 or the second discriminating pad 432 to either the output of the shield driver 116 via conductive line 464 ("S"), or to respective ground connections 120 and 124 ("G"). Then the possible measurement configurations can be written as: measurement A: {S, S}; measurement B: {G, G}; measurement C: {S, G}; measurement D: {G, S}. At the end of a single measurement cycle, there will be 4 capacitive measurements corresponding to all possible configurations of the discriminating pad connections. The capacitive measurements at the end of the single measurement cycle will be hereafter referred to as a "measurement set" (e.g., capacitive measurement set (A,B, C,D)).

Switching discriminating pads 430 and 432 between respective ground connections 120 and 124 and the output of shield driver 116 via conductive line 464 results in a change in the electric field lines between the capacitive sensing pad 428 and the surrounding substance 436, resulting in 4 different capacitive measurements. The degree to which these measurements change will be dependent on the intrinsic electromagnetic properties of the material.

In the embodiments illustrated herein, the capacitive measurements may be used to determine the intrinsic properties of a substance such as the dipole moment, $\mu$, and the dielectric constant, $\varepsilon_r$. The dielectric constant is a measure of the energy contained in an electric field in a substance. The dipole moment is a measure of the asymmetry of the electric charge distribution of a molecule. The dielectric constant is a function of varying temperature. The dipole moment remains constant with varying temperature. In order to determine the relationship between the substance properties and the capacitive measurements, in the illustrated embodiment, a set of sample measurement sets are taken using substances that are of interest are taken and that cover the range of properties of interest. The sample measurement sets are analyzed using data analysis techniques. In various embodiments, various methods of numerical modeling and optimization are utilized to derive mathematical relationships between the capacitive measurements and the observed numerical properties. These methods include, but are not limited to, the application of evolutionary search, genetic algorithms, high dimensional splines, and linear and non-linear optimization.

Referring to FIG. 4, there may be a non-negligible background capacitance that exists even when there is no substance 436, for example due to parasitic capacitance in the sensing pad unit 126, or to the capacitive effects of the physical installation of the sensor system 400, and it may be necessary to perform a baseline measurement of this background capacitance for each configuration of the discriminating pads, and then use these values to remove the background reading from further measurements. Consequently there will be 4 baseline values. These baseline values correspond to measurement configurations which are: measurement A: {S, S}; measurement B: {G, G}; measurement C: {S, G}; measurement D: {G, S}. Typical methods of establishing a baseline are to compute the mean or the median of a set of measurements taken in the absence of a proximate object. Consequently, in the illustrated embodiment, there will be 4 baseline values. Typical methods of establishing a baseline are to compute the mean or the median of a set of measurements taken in the absence of a substance 436 within container 438 or if the sensing pad unit 426 is placed away from any nearby objects or materials and or away from container 438.

Figure 5:
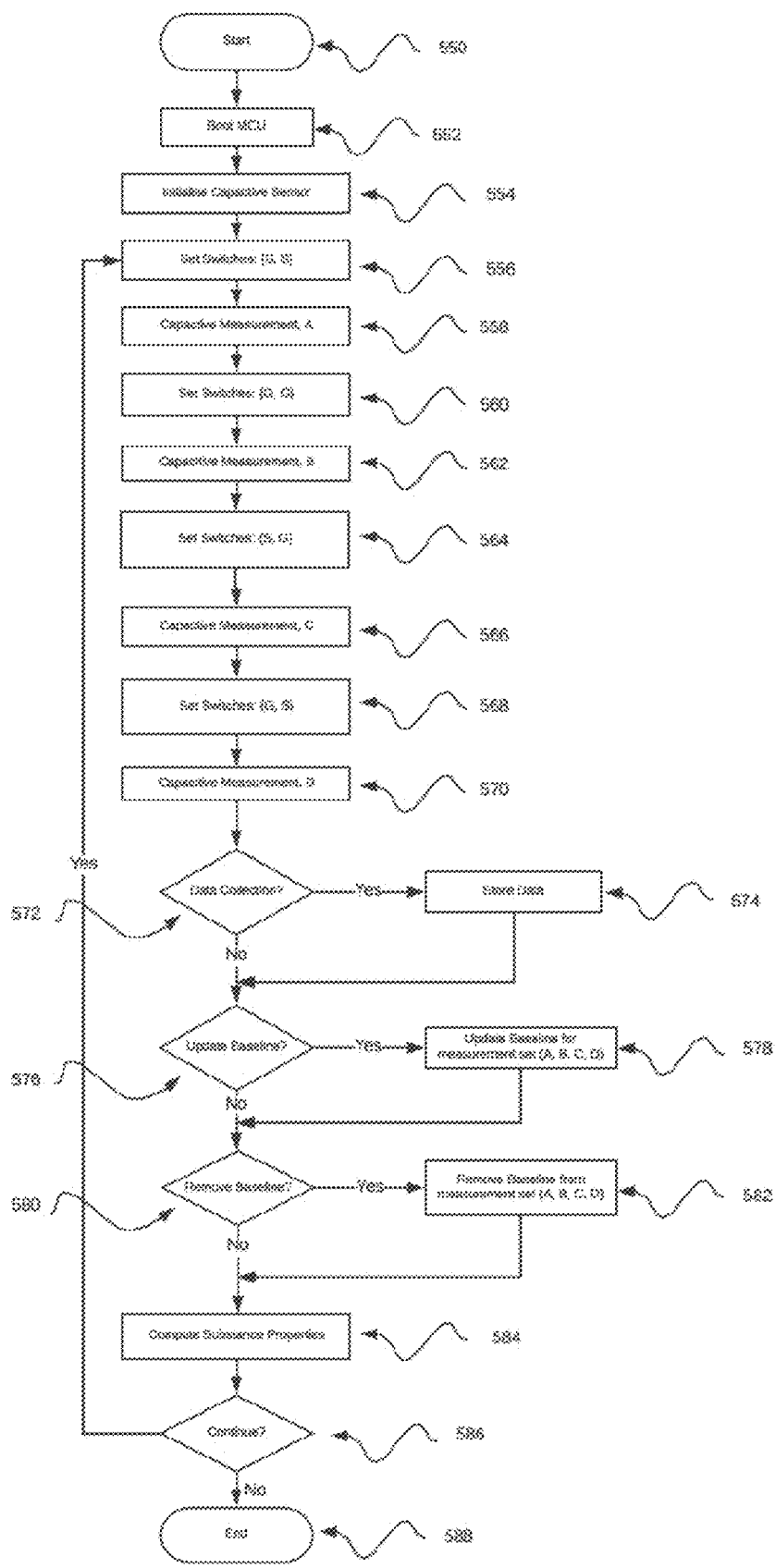
FIG. 5 illustrates a flow chart of an embodiment of a measurement process.

FIG. 5 illustrates a flow chart of an embodiment of a measurement process. On 550 the control unit 112 performs its initialization process 552. The capacitive to digital sensor 114 performs its initialization process 554 with the measurement parameters set by the control unit 112. These parameters are specific to each capacitive sensor but may include parameters like measurement rate, channel number, method of offset, and accuracy. The first switch 118 and the second switch 122 are set to state {S,S} at 556. A capacitive measurement, A, is made at 558. The first switch 118 and the second switch 122 are set to state {G,G} at 560. A second capacitive measurement, B, is made at 562. The first switch 118 and the second switch 222 are set to state {S,G} at 564. A third capacitive measurement, C, is made at 566. The first switch 118 and the second switch 122 are set to state {G,S} at 568. A fourth capacitive measurement, D, is made at 570.

If these measurement are part of a data collection process at 572, such as to be used as sample data for a modeling or optimization analysis, then the data is stored at 574 for later transfer to a memory device.

If these measurements are part of a baseline process at 576 then the baseline is calculated and updated at 578. If the baseline is to be removed from the measurement at 580 then the baseline is removed at 582. If substance properties or identification of material properties based on measured capacitance, published versus measured dielectric constants or published versus measured dipole moments are required then this process is implemented at 584. If the process continues at 586 then the process returns to the switch process settings at 556, otherwise the process halts at 580.

Figure 6:
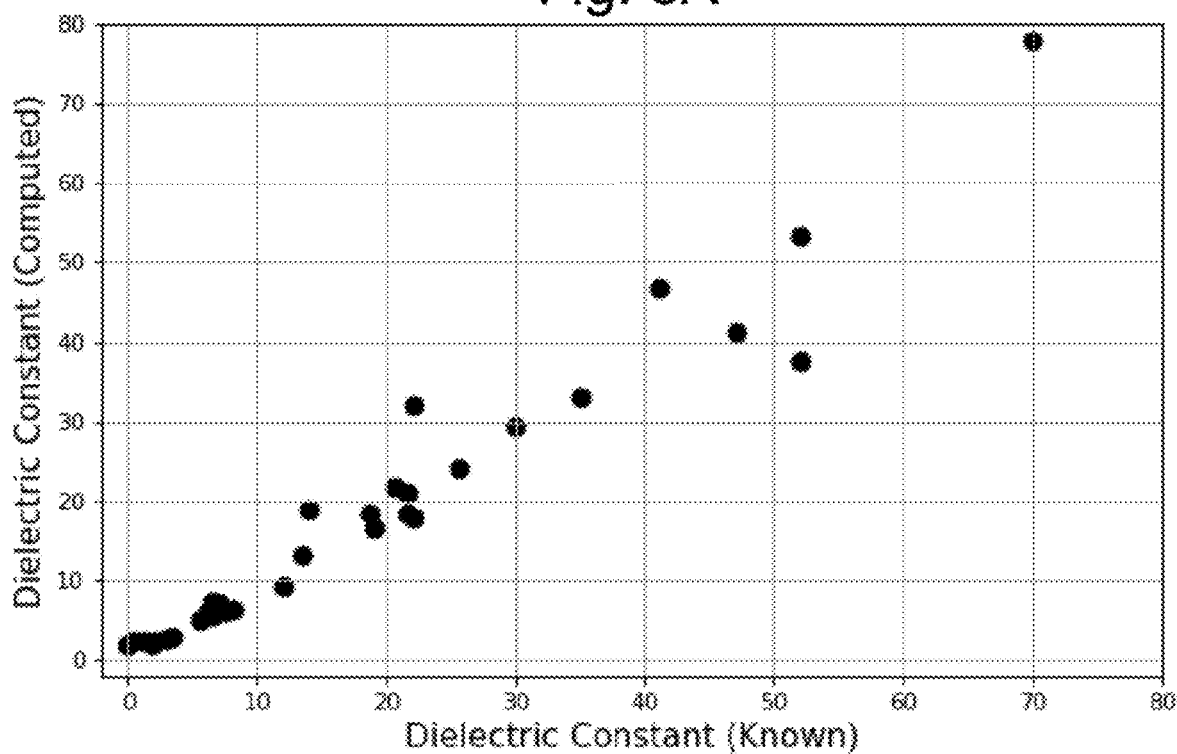
FIGS. 6A-6B illustrate scatter plots of embodiments of measured versus known values for a dielectric constant and dipole moment for several liquid substances.

FIGS. 6A-6B illustrate scatter plots of embodiments of computed versus known values for a dielectric constant and a dipole moment for several liquid substances. FIG. 6A illustrates an embodiment of a scatter-plot of computed vs. known dielectric constant for several liquid substances. The horizontal x-axis illustrates known values, obtained from the CRC Handbook of Chemistry and Physics (97th edition, published by CRC Press). The vertical y-axis illustrates values derived from capacitance measurements from the embodiments illustrated in FIG. 4 and FIG. 5, with the capacitive sensing pad illustrated in FIG. 3G. The vertical y-axis values are obtained from measuring the dielectric constant as illustrated in FIG. 4 and FIG. 5, taking measurement sets as described in FIG. 5 for each one of one or more liquid substances, and deriving a mathematical relationship, formula or equation between the measurement sets for the one or more liquid substances and the known dielectric constants for the one or more liquid substances that enables the measurement sets (as inputs to the mathematical relationship) to approximate the known dielectric constants (as outputs of the mathematical equation). In the illustrated embodiment, the mathematical relationship enables mapping of computed dielectric constants to known dielectric constants and allows substances or materials to be identified based on their known dielectric constants.

In the illustrated embodiment, this mathematic relationship between the measurement set and the dielectric constant is a low order non-linear rational polynomial equation derived by taking all of the measured data or a subset of the measured data and using evolutionary search software (e.g., Eureqa; www.nutonian.com). The equation uses as inputs the measured data and provides outputs that approximate the known data as illustrated in FIG. 6A such that a linear relationship between the output of the equation and the known dielectric constants can be achieved. This equation enables identification of other materials that are not tested based solely on their known dielectric constants.

In the illustrated embodiment, the dimensions of the capacitive sensing pad 428 was 6 mm by 12 mm, the width of the first discriminating pad 430 was 1.5 mm, and the separation between the capacitive sensing pad 428 and the first discriminating pad 430 was 1 mm. The width of the second discriminating pad 432 was 3 mm and the separation between the first discriminating pad 430 and the second discriminating pad 432 was 1 mm.

Referring now to FIG. 6B which illustrates an embodiment of a scatter plot of computed vs. known values for the dipole moment for several liquid substances. The horizontal x-axis illustrates known values, obtained from the CRC Handbook of Chemistry and Physics (97th edition, published by CRC Press. The vertical y-axis are values derived from capacitance measurements from the embodiments illustrated in FIG. 4 and FIG. 5, with the capacitive sensing pad illustrated in FIG. 3G. The vertical y-axis illustrates values are obtained from measuring the dipole moment as illustrated in FIG. 4 and FIG. 5, taking measurement sets as described in FIG. 5 for each one of one or more liquid substances, and deriving a mathematical relationship, formula or equation between the measurement sets for the one or more liquid substances and the known dipole moments for the one or more liquid substances that enables the measurement sets (as inputs to the mathematical relationship) to approximate the known dipole moments (as outputs of the mathematical equation). In the illustrated embodiment, the mathematical relationship enables mapping of computed dipole moments to known dipole moments and allows substances or materials to be identified based on their known dipole moments.

In the illustrated embodiment, this mathematic relationship between the measurement set and the dipole moment is a low order non-linear rational polynomial equation derived by taking all of the measured data or a subset of the measured data and using evolutionary search software (e.g., Eureqa; www.nutonian.com). The equation uses as inputs the measured data and provides outputs that approximate the known data as illustrated in FIG. 6B such that a linear relationship between the output of the equation and the known dipole moments can be achieved. This equation enables identification of other materials that are not tested based solely on their known dipole moments.

In the illustrated embodiment, the dimensions of the capacitive sensing pad 428 was 6 mm by 12 mm, the width of the first discriminating pad 430 was 1.5 mm and the separation between the capacitive sensing pad 428 and the first discriminating pad 430 was 1 mm. The width of the second discriminating pad 432 was 3 mm and the separation between the first discriminating pad 430 and the second discriminating pad 432 was 1 mm. The capacitive measurement sets obtained by the embodiment illustrated in FIG. 4, including four measurements which are a measurement set (A, B, C and D), will depend on the configuration of sensing pad unit 426 and on the specific geometry of container 438.

In the illustrated embodiment, the sensing pad unit 436 is inside the container 438 and is immersed in the liquid or substance contained within container 438. In other embodiments, sensing pad unit 438 can be attached to, or near, the inside wall of the container 438, or can be attached to, or near, the outside wall of the container 438, such that sensing pad unit 438 is not immersed in the liquid or substance contained within container 438.

Figure 7:
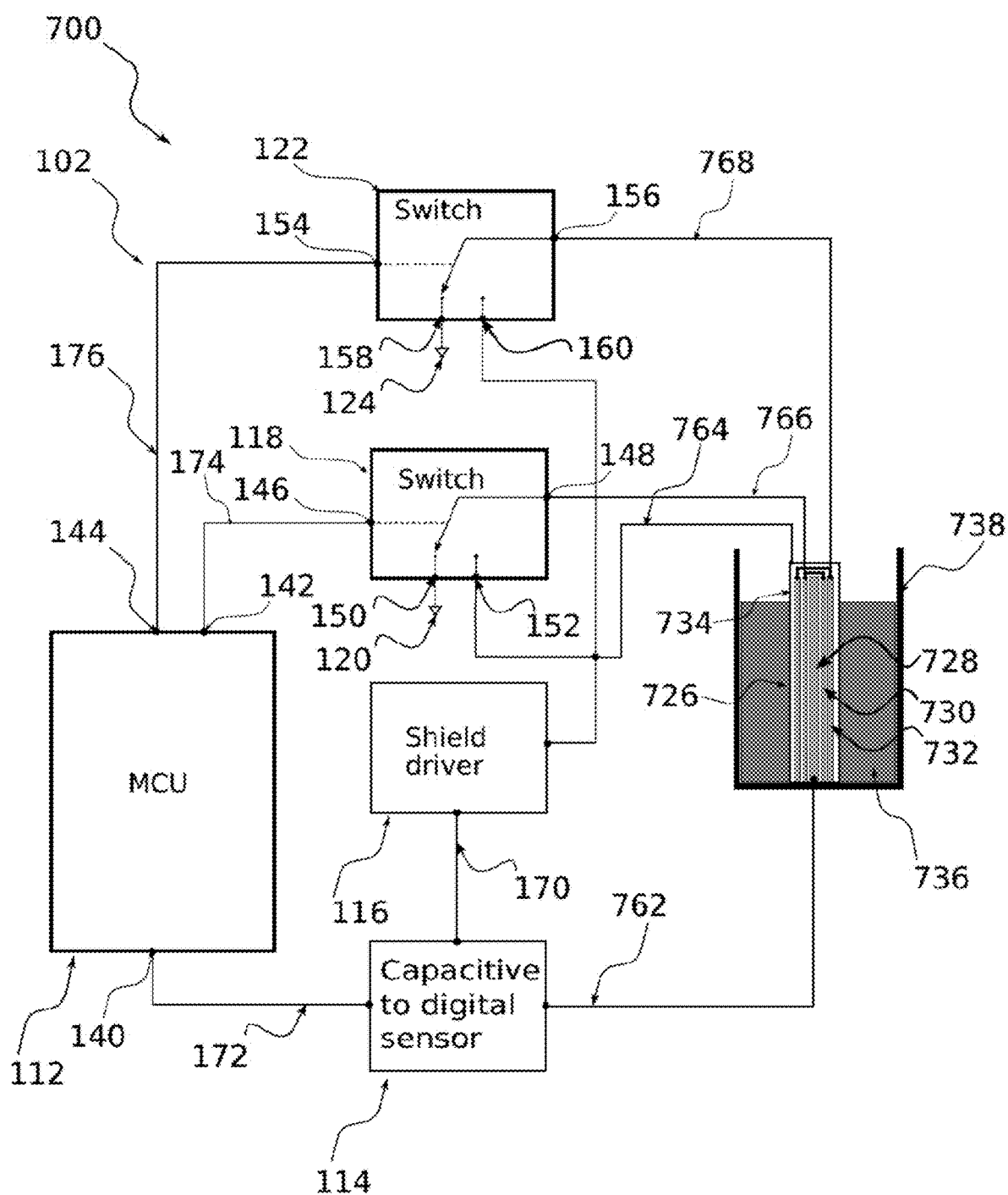
FIG. 7 illustrates an embodiment of a system which includes a sensor measurement system and a sensing pad unit.

FIG. 7 illustrates an embodiment of a system 700 which includes a sensor measurement system 102 and a sensing pad unit 726. The sensor measurement system 102 is described with respect to FIG. 1. In the illustrated embodiment, a substance 736 is placed inside a container 738. The sensing pad unit 726 is attached to the outside wall of the container 738. In various embodiments, the substance can be a liquid or can be a granular material. In the illustrated embodiment, the capacitive to digital sensor 114 is connected to the capacitive sensing pad 726 via conductive line 762, and is also coupled to the input of the shield driver 116 via conductive line 170. The inputs 146 and 154 of the respective switches 118 and 122 are controlled by the control unit 112. The output of the shield driver 116 is connected to the shield pad 734 via conductive line 764. In other embodiments, the sensing pad unit 726 is attached to the inside surface of the container 738.

In the illustrated embodiment, the capacitance sensing pad 728, the discriminating pads 730 and 732, and shield pad 734, are constructed of conductive materials such as metals. By way of example, this can include a printed circuit board, a flex-PCB, copper tape, or conductive cloth, but can also be any other conductive substance. In other embodiments where the sensing pad unit 726 is immersed in the contents of the container 738, the conductive elements of the sensing pad unit 726 are electrically isolated from the contents of the container 738 by a suitable non-conductive protective material.

In the illustrated embodiment, shield driver 116 is electrically connected to shield pad 734 via conductive line 764 and shield driver 116 drives shield pad 734 to the same voltage potential as capacitive sensing pad 728. Therefore, there is no electric field between the capacitive sensing pad 728 and the shield pad 734. Consequently, any capacitive effect of a material behind the shield pad 734 on a capacitance measurement by capacitance to digital sensor 114 is nullified. In usage the shield pad 734 is used to provide directional sensitivity to the capacitive sensing pad 728 and to limit the capacitive effects of material behind the shield pad 734. In the illustrated embodiment, the shield driver 116 maintains the shield pad 734 at this voltage potential which is the same voltage potential as capacitive sensing pad 728. In the illustrated embodiment, the shield pad 734 is placed in close proximity to the capacitive sensing pad 728, typically a distance of a few tenths of a millimeter up to a few millimeters. In this embodiment, the separation between the capacitive sensing pad 728 and the shield pad 734 is less than the overall dimensions of the capacitive sensing pad 728. The shield pad 734 may be a separate physical construction to the capacitive pad 728 and discriminating pads 730 and 732, but may also be within the substrate of these pads such as with a multilayer printed circuit board. The size and shape of the capacitive sensing pad 728 and the discriminating pads 730 and 732 will depend on the particular application and geometry.

The input terminal 146 of the first switch 118 is electrically connected to I/O terminal 142 of the control unit 112 via conductive line 174. The common node 148 of the first switch 118 is electrically connected to the first discriminating pad 730 via conductive line 766. One output terminal 150 of the first switch 118 is connected to a ground potential at 120, and the other output terminal 152 is connected to the output of the shield driver 116 via conductive line 764. The input terminal 154 of the second switch 122 is connected to I/O terminal 144 of the control unit 112 via conductive line 176. The common node 156 of the switch 122 is connected to the second discriminating pad 732 via conductive line 768. One output terminal 158 of the switch 122 is connected to a ground potential at 124, the other output terminal 160 is connected to the output of the shield driver 116 via conductive line 764. The switches 118 and 122 are controlled by the control unit 112 such that when the user wants to make a measurement with the capacitive sensing pad 728 when either or both of the discriminating pads 730 and 732 are connected to the ground potential respectively at 120 and/or 124 or to the output of the shield driver 116 via conductive line 764, the control unit 112 will set the input terminals 146 and 154 of respective switches 118 and 122 to the appropriate value, H or L. It is understood that the specifics of this will depend on the chosen implementation of the switches 118 and 122, and that the order of the switching is not important to the method.

If we write in shorthand {X,Y} where X and Y represent the connection state of the first switch 118 and the second switch 122 respectively, where the connection state can take the values of either "S" or "G" which representing the state when the first switch 118 or the second switch 122 connects respectively the first discriminating pad 730 or the second discriminating pad 732 to either the output of the shield driver 116 via conductive line 764 ("S"), or to respective ground connections 120 and 124 ("G"). Then the possible measurement configurations can be written as: measurement A: {S, S}; measurement B: {G, G}; measurement C: {S, G}; measurement D: {G, S}. At the end of a single measurement cycle, there will be 4 capacitive measurements corresponding to all possible configurations of the discriminating pad connections. The capacitive measurements at the end of the single measurement cycle will be hereafter referred to as a "measurement set" (e.g., capacitive measurement set (A,B, C,D)).

Switching discriminating pads 730 and 732 between respective ground connections 120 and 124 and the output of the shield driver 116 via conductive line 764 results in a change in the electric field lines between the capacitive sensing pad 728 and the surrounding substance 736, resulting in 4 different capacitive measurements. The degree to which these measurements change will be dependent on the intrinsic electromagnetic properties of the material which for some properties, such as the dielectric constant, is a function of temperature. The capacitive measurement sets may be used to determine the intrinsic properties such as the dielectric constant, $\varepsilon_r$, and therefore the temperature, or to directly derive a relationship between the measurement sets and the temperature.

In order to determine the relationship between the level and temperature of the substance and the capacitive measurements, in the illustrated embodiment, a set of sample measurement sets is taken using for each of a range of the substance of interest and that cover the range of volumes and temperatures of interest. These sample sets of measurement sets can be analyzed using data analysis techniques as discussed above with respect to FIGS. 6A and 6B.

A typical method is to apply the any of the various methods of numerical modeling and optimization to derive formulaic relationships between the capacitive measurements and the observed numerical properties. These methods include, but are not limited to, the application of evolutionary search, genetic algorithms, high dimensional splines, and linear and non-linear optimization.

Figure 8A:
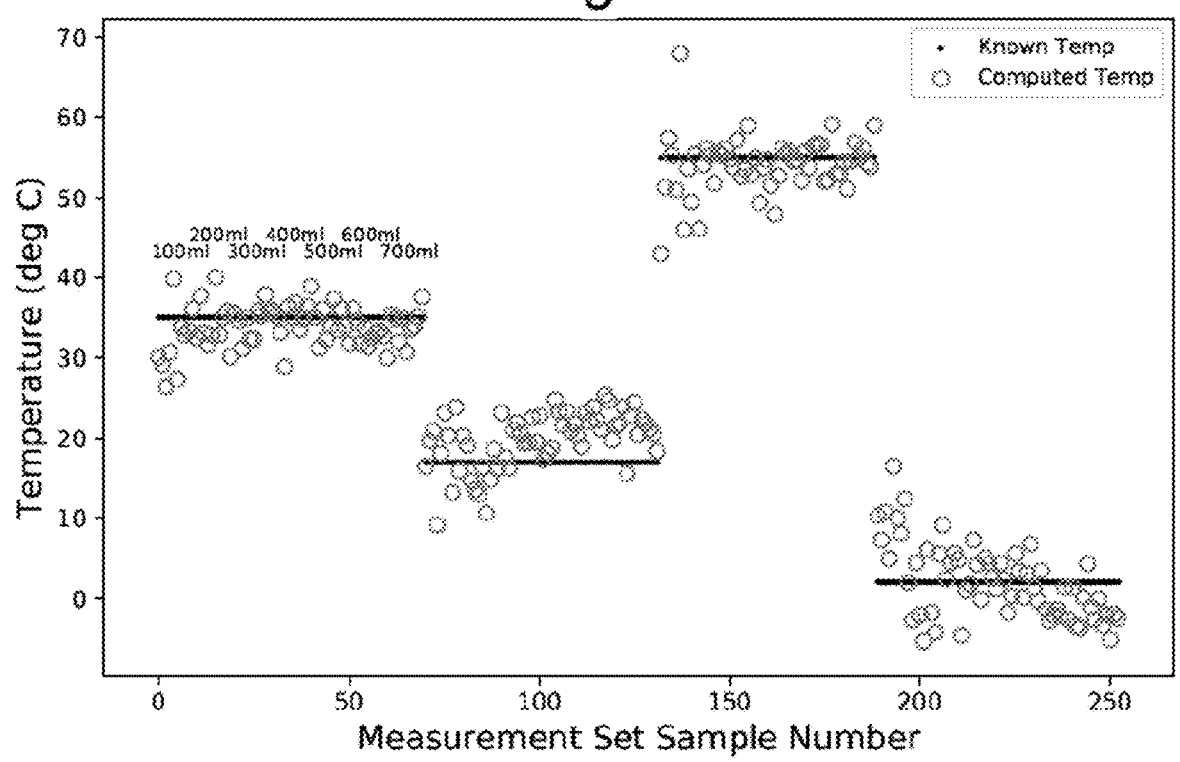
FIGS. 8A-8B illustrate scatter plots of measured versus computed values for temperature and volume of a liquid.
Figure 8B:
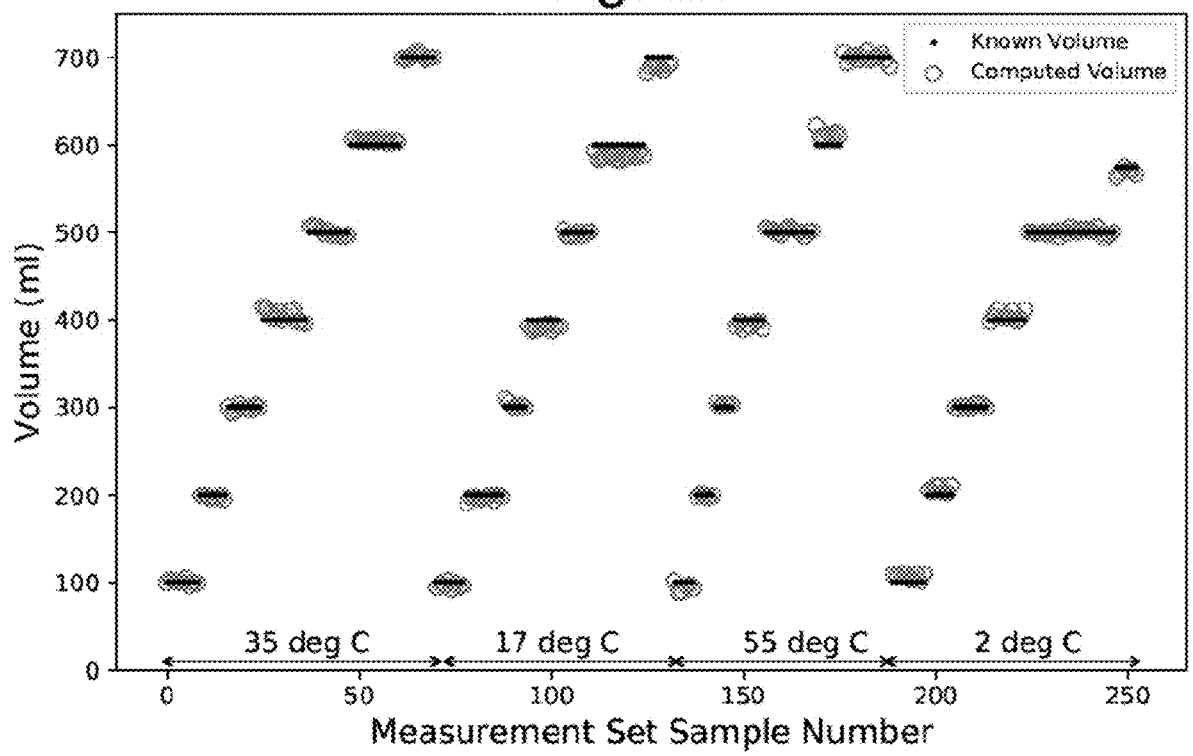

FIGS. 8A-8B illustrate scatter plots of measured versus computed values for temperature and volume of a liquid. FIG. 8A illustrates a scatter-plot of known and computed temperatures for water in a tank over a range of volumes of approximately 100 ml to 700 ml. In the illustrated embodiments, the capacitive measurement method illustrated in FIG. 5 can be used, and the system 400 illustrated in FIG. 4 can be used where the tank is container 438, the system 700 illustrated in FIG. 7 can be used where the tank is container 738, or the system 900 illustrated in FIG. 9 can be used where the tank is container 938. The horizontal x-axis illustrates the sample or measurement number, and the vertical y-axis illustrates temperature.

In the illustrated embodiment, the capacitive sensing pad and discriminating pad unit configuration illustrated in FIG. 3H was used to obtain the capacitive measurements. In the illustrated embodiment, the dimensions of the capacitive sensing pad 392 used was 15 mm by 170 mm, the width of the first inner discriminating pad 393 and the second inner discriminating pad 394 was 3 mm, and the separation between either the first inner discriminating pad 393 or the second inner discriminating pad 394 and the capacitive sensing pad 392 was 1 mm. The width of the first outer discriminating pad 395 and the second outer discriminating pad 396 was 5 mm, and the separation between first outer discriminating pad 395 and the first inner discriminating pad 393, or between the second outer discriminating pad 396 and the second inner discriminating pad 394 was 1 mm. The width is measured in a vertical direction relative to the orientation of the discriminating pad unit configuration illustrated in FIG. 3H.

In the illustrated embodiment, water at a fixed temperature was added to the tank in 100 ml quantities and one or more capacitive measurements sets were obtained for each level of the water in the tank. Referring to FIG. 5, a capacitance measurement set is the four capacitive measurements defined in FIG. 5 which are capacitive measurements A at 558, B at 562, C at 566, and D at 570, referred to as capacitive measurement set (A,B,C,D). In various embodiments, the capacitive measurements sets (A,B,C,D obtained for each level of the water in the tank can be one, 10, 20 or 100. In other embodiments, any suitable number of capacitive measure sets (A,B,C,D) can be used. In the illustrated embodiment, capacitive measurements sets (A,B,C,D) were obtained for four temperatures which were 2 deg C., 17 deg C., 35 deg C. and 55 deg C. over a range of volumes from 100 ml to 700 ml in 100 ml increments for each temperature.

In order to derive a mathematical relationship between the sensor measurement set and the temperature, a low order non-linear rational polynomial was derived by taking a subset of the measured data and using commercially available evolutionary search software (Eureqa; www.nutonian.com (See also, FIG. 6A and FIG. 6B). The computed values plotted in FIG. 8A are computed by applying the derived formula to the unused subset of measured data. For water at 35 deg C., the plot has been annotated to show the range of water volume added to the tank in 100 ml quantities where the range illustrated is from 100 ml to 700 ml. The same range of water volume added to the tank in 100 ml quantities from 100 ml to 700 ml applies to the other three temperatures which are 2 deg C., 17 deg C. and 55 deg C.

In the illustrated embodiment, the vertical y-axis values for computed temperature were obtained for each of the four temperatures (2 deg C., 17 deg C., 35 deg C. and 55 deg C.) by measuring or taking a number of capacitive measurement sets (A,B,C,D) as described above and deriving a mathematical relationship, formula or equation between a subset of the number of capacitive measurement sets (A,B,C,D) and the known temperature. In various embodiments, a subset of the number of capacitive measurement sets (A,B, C,D) can be half of the number of capacitive measurement sets (A,B,C,D) such that if the number of capacitive measurement sets (A,B,C,D) is 10 or 20, the subset would be, respectively 5 or 10 measurement results. In other embodiments, the subset of the overall number of capacitive measurement sets (A,B,C,D) used to derive the mathematical relationship, formula or equation can be 10%, 90%, or any other suitable number of the overall number of capacitive measurement sets (A,B,C,D) used to derive the mathematical relationship, formula or equation. In these embodiments, the capacitive measurement sets (A,B,C,D) that were not part of the subset are used to validate the mathematical relationship, formula or equation. In these embodiments, the capacitive measurement sets (A,B,C,D) that were not part of the subset were used to generate the computed temperatures illustrated in FIG. 8A in order to validate the mathematical relationship, formula or equation. In other embodiments, the entire number of capacitive measurement sets (A,B,C,D) are used to derive a mathematical relationship, formula or equation and a second set of capacitive measurement sets (A,B,C,D) are taken to validate the mathematical relationship, formula or equation.

In the illustrated embodiment, the subset of the number of capacitive measurement sets (A,B,C,D) are used to determine a mathematical relationship, formula or equation that enables the subset of the number of capacitive measurement sets (A,B,C,D), as inputs to the mathematical relationship, formula or equation, to define or approximate the known or measured temperature as an output of the mathematical equation. The capacitive measurement sets (A,B,C,D) that were not part of the subset were used to generate the computed temperatures illustrated in FIG. 8A in order to validate the mathematical equation. The mathematic relationship is a low order non-linear rational polynomial equation derived by taking all of the measured data or a subset of the measured data and using evolutionary search software (e.g., Eureqa; www.nutonian.com). The equation uses as inputs the capacitive measurement sets and provides outputs that approximate the temperature as illustrated in FIG. 8A.

In the illustrated embodiment, n conductive discriminating pads were used where n=2 in order to obtain the capacitive measurement set (A,B,C,D). In other embodiments, n=1 for a capacitive measurement set (A,B) or n≥3 such as for n=3 to obtain 8 capacitive measurements for a capacitive measurement set (A,B,C,D,E,F,G,H) can be used. In other embodiments, any suitable number of n can be used to obtain the capacitive measurement set.

FIG. 8B illustrates a scatter-plot of measured and computed volumes for water in a tank over a range of volumes of approximately 100 ml to 700 ml and for four temperatures which are 2 deg C., 17 deg C., 35 deg C. and 55 deg C. The embodiments illustrated in FIG. 8B utilize the same capacitive measurement methods and systems used and described with respect to FIG. 8A. The horizontal x-axis illustrates the sample or measurement number for each of the four temperatures, and the vertical y-axis represents a volume of the water in the tank as described with respect to FIG. 8A. The capacitive measurement data set or capacitive measurements sets (A,B,C,D) used for the embodiments described in FIG. 8B are the same as described above in FIG. 8A. In order to derive a mathematical relationship between the sensor capacitive measurement set and the volume for each of the four temperatures, a low order non-linear rational polynomial was derived by taking a subset of the measured data and using commercially available evolutionary search software (Eureqa; www.nutonian.com) (See also, FIG. 6A and FIG. 6B). The computed values plotted in FIG. 8B are computed by applying the derived formula to the unused subset of measured data. The temperature for each volume step is shown at the base of the plot. The embodiment illustrated in FIG. 8B provides a method to determine a volume and temperature simultaneously for a substance. The substance in the container that the volume and temperature are determined for can be a liquid or a solid particulate.

In the illustrated embodiment, the vertical y-axis values for computed volume were obtained for each of the four temperatures (2 deg C., 17 deg C., 35 deg C. and 55 deg C. by measuring or taking a number of capacitive measurement sets (A,B,C,D) as described above with respect to the description for FIG. 8A, and deriving a mathematical relationship or equation between a subset of the number of capacitive measurement sets (A,B,C,D) and the measured or known volume. In various embodiments, a subset of the number of capacitive measurement sets (A,B,C,D) can be half of the number of capacitive measurement sets (A,B,C,D) such that if the number of capacitive measurement sets (A,B,C,D) is 10 or 20, the subset would be, respectively 5 or 10 measurement results. In other embodiments, the subset of the overall number of capacitive measurement sets (A,B,C,D) used to derive the mathematical relationship, formula or equation can be 10%, 90%, or any other suitable number of the overall number of capacitive measurement sets (A,B,C,D) used to derive the mathematical relationship, formula or equation. In these embodiments, the capacitive measurement sets (A,B,C,D) that were not part of the subset are used to validate the mathematical relationship, formula or equation. In these embodiments, the capacitive measurement sets (A,B,C,D) that were not part of the subset were used to generate the computed temperatures illustrated in FIG. 8A in order to validate the mathematical relationship, formula or equation. In other embodiments, the entire number of capacitive measurement sets (A,B,C,D) are used to derive a mathematical relationship, formula or equation and a second set of capacitive measurement sets (A,B,C,D) are taken to validate the mathematical relationship, formula or equation.

In the illustrated embodiment, the subset of the number of capacitive measurement sets (A,B,C,D) are used to determine a mathematical relationship, formula or equation that enables the subset of the number of capacitive measurement sets (A,B,C,D), as inputs to the mathematical relationship, formula or equation, to define or approximate the known or measured temperature as an output of the mathematical equation. The capacitive measurement sets (A,B,C,D) that were not part of the subset were used to generate the computed volumes as illustrated in FIG. 8B in order to validate the mathematical equation. The mathematic relationship is a low order non-linear rational polynomial equation derived by taking all of the measured data or a subset of the measured data and using evolutionary search software (e.g., Eureqa; www.nutonian.com). The equation uses as inputs the capacitive measurement sets and provides outputs that approximate the volume as illustrated in FIG. 8B.

In the illustrated embodiment, n conductive discriminating pads where n=2 were used to obtain the capacitive measurement set (A,B,C,D). In other embodiments, n=1 for a capacitive measurement set (A,B or n≥3 such as for n=3 to obtain 8 capacitive measurements for a capacitive measurement set (A,B,C,D,E,F,G,H). In other embodiments, any suitable number of n can be used to obtain the capacitive measurement set.

In the illustrated embodiments of FIG. 8A and FIG. 8B, there may be a non-negligible background capacitance that exists even when there is no water in the tank or container, for example due to parasitic capacitance in the sensing pad unit 126, or to the capacitive effects of the physical installation of the sensor system 100, and it may be necessary to perform a baseline measurement of this background capacitance for each configuration of the discriminating pads, and then use these values to remove the background reading from further measurements. Consequently there will be 4 baseline values. These baseline values correspond to measurement configurations which are: measurement A: {S, S}; measurement B: {G, G}; measurement C: {S, G}; measurement D: {G, S}. Typical methods of establishing a baseline are to compute the mean or the median of a set of measurements taken in the absence of a proximate object.

Figure 9:
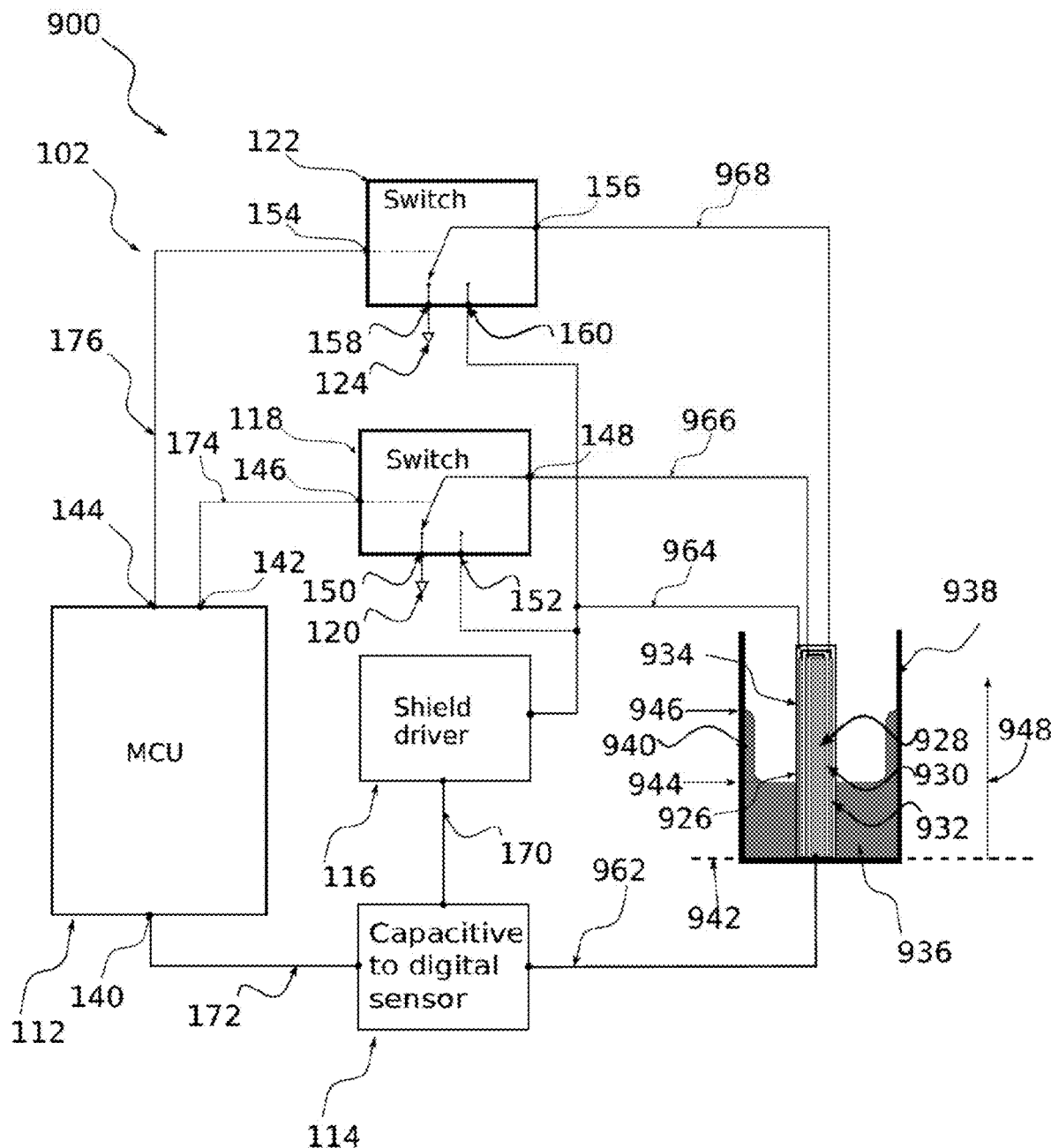
FIG. 9 illustrates an embodiment of a system which includes a sensor measurement system and a sensing pad unit.

FIG. 9 illustrates an embodiment of a system 900 which includes a sensor measurement system 102 and a sensing pad unit 926. Sensor measurement system 102 is described with respect to FIG. 1. In the illustrated embodiment, a substance 936 is placed inside a container 938. The sensing pad unit 926 is attached to an outside wall of container 938. In various embodiments, the substance can be a liquid or can be a granular material. The wall adhesion by viscous fluids and particulates within container 938 is illustrated as substance adhesion layer 940. The bottom of container 938 is illustrated at 942, the level of substance 936 at the sidewall of container 938 with respect to the height 948 of the sidewall is illustrated at 944, the bottom of substance adhesion layer 940 with respect to with respect to the height 948 of the sidewall of container 938 is illustrated at 944, and the top of substance adhesion layer 940 with respect to the height 948 the sidewall of container 938 is illustrated at 946.

In the illustrated embodiment, the sensor measurement system 102 comprises a control unit 112, a capacitive to digital sensor 114, a shield driver 116, a single-pole double-throw switch 118, a second single-pole double-throw switch 122, and a sensing pad unit 926 that includes a capacitive sensing pad 928, a proximate discriminating pad 930, a second proximate discriminating pad 932, and a shield 934.

In the illustrated embodiment, the capacitance sensing pad 928, the discriminating pads 930 and 932, and shield pad 934, are constructed of conductive materials such as metals. By way of example, this can include a printed circuit board, a flex-PCB, copper tape, or conductive cloth, but can also be any other conductive substance. In this embodiment, the conductive elements of the sensing pad unit are electrically isolated from the contents of the container 936 by a suitable non-conductive protective material.

In the illustrated embodiment, shield driver 116 is electrically connected to shield pad 934 via conductive line 964 and shield driver 116 drives shield pad 934 to the same voltage potential as capacitive sensing pad 928. Therefore, there is no electric field between the capacitive sensing pad 928 and the shield pad 934. Consequently, any capacitive effect of a material behind the shield pad 934 on a capacitance measurement by capacitance to digital sensor 114 is nullified. In usage, the shield pad 934 is used to provide directional sensitivity to the capacitive sensing pad 928 and to limit the capacitive effects of material behind the shield pad 934. In the illustrated embodiment, the shield driver 116 maintains the shield pad 934 at this voltage potential which is the same voltage potential as capacitive sensing pad 928. In the illustrated embodiment, the shield pad 934 is placed in close proximity to the capacitive sensing pad 928, typically a distance of a few tenths of a millimeter up to a few millimeters. In this embodiment, the separation between the capacitive sensing pad 928 and the shield pad 934 is less than the overall dimensions of the capacitive sensing pad 928. The shield pad 934 may be a separate physical construction to the capacitive pad 928 and discriminating pads 930 and 932, but may also be within the substrate of these pads such as with a multilayer printed circuit board. The size and shape of the capacitive sensing pad 928 and the discriminating pads 930 and 932 will depend on the particular application and geometry.

The input terminal 146 of the first switch 118 is electrically connected to I/O terminal 142 of the control unit 112 via conductive line 174. The common node 148 of the first switch 118 is electrically connected to the first discriminating pad 930 via conductive line 966. One output terminal 150 of the first switch 118 is connected to a ground potential at 120, and the other output terminal 152 is connected to the output of the shield driver 116 via conductive line 96. The input terminal 154 of the second switch 122 is connected to I/O terminal 144 of the control unit 112 via conductive line 176. The common node 156 of the switch 122 is connected to the second discriminating pad 932 via conductive line 968. One output terminal 158 of the switch 122 is connected to a ground potential at 124, the other output terminal 160 is connected to the output of the shield driver 116 via conductive line 964. The switches 118 and 122 are controlled by the control unit 112 such that when the user wants to make a measurement with the capacitive sensing pad 928 when either or both of the discriminating pads 930 and 932 are connected to the ground potential respectively at 120 and/or 124 or to the output of the shield driver 116 via conductive line 964, the microcontroller will set the input terminals 146 and 154 of respective switches 118 and 122 to the appropriate value, H or L. It is understood that the specifics of this will depend on the chosen implementation of the switches 118 and 122, and that the order of the switching is not important to the method.

If we write in shorthand {X,Y} where X and Y represent the connection state of the first switch 118 and the second switch 122 respectively, and the connection state can take the values "S" or "G", representing the state when the first switch 118 or the second switch 122 connects first discriminating pad 930 or second discriminating pad 932 to the output of the shield driver 116 via conductive line 964 or to respective ground connections 120 and 124 ("G"). Then the possible measurement configurations can be written as: measurement A: {S, S}; measurement B: {G, G}; measurement C: {S, G}; measurement D: {G, S}. At the end of a single measurement cycle, there will be 4 capacitive measurements corresponding to all possible configurations of the discriminating pad connections. The capacitive measurements at the end of the single measurement cycle will be hereafter referred to as a "measurement set" (e.g., capacitive measurement set (A,B,C,D)).

Switching discriminating pads 930 and 932 between respective ground connections 120 and 124 and the output of the shield driver 116 via conductive line 964 results in a change in the electric field lines between the capacitive sensing pad 928 and the surrounding substance 936, resulting in 4 different capacitive measurements. The degree to which these measurements change will be dependent on the intrinsic electromagnetic properties of the material and the shape of the material. The capacitive measurements may be used to determine these properties.

In order to determine the relationship between the level, volume, mass or quantity of the substance 936 in container 938, one or more sample capacitive measurements sets (A,B,C,D) are taken using substance 936 that cover the range of level, volume, mass or quantity, or of wall adhesion 940. These sample capacitive measurement sets can be analyzed using data analysis techniques as discussed above with respect to FIGS. 6A and 6B.

A typical method is to apply the any of the various methods of numerical modeling and optimization to derive formulaic relationships between the capacitive measurements and the observed numerical properties. These methods include, but are not limited to, the application of evolutionary search, genetic algorithms, high dimensional splines, and linear and non-linear optimization.

In the illustrated embodiment, the path of electric field lines within the substance 936 will be altered by any nearby boundary, such as the boundary between the air and the surface of the substance adhesion layer 940. Capacitive measurement sets (A,B,C,D) may be affected by the thickness of the substance adhesion layer 940 and by the volume of the substance 936 within the substance adhesion layer 940.

Figure 10:
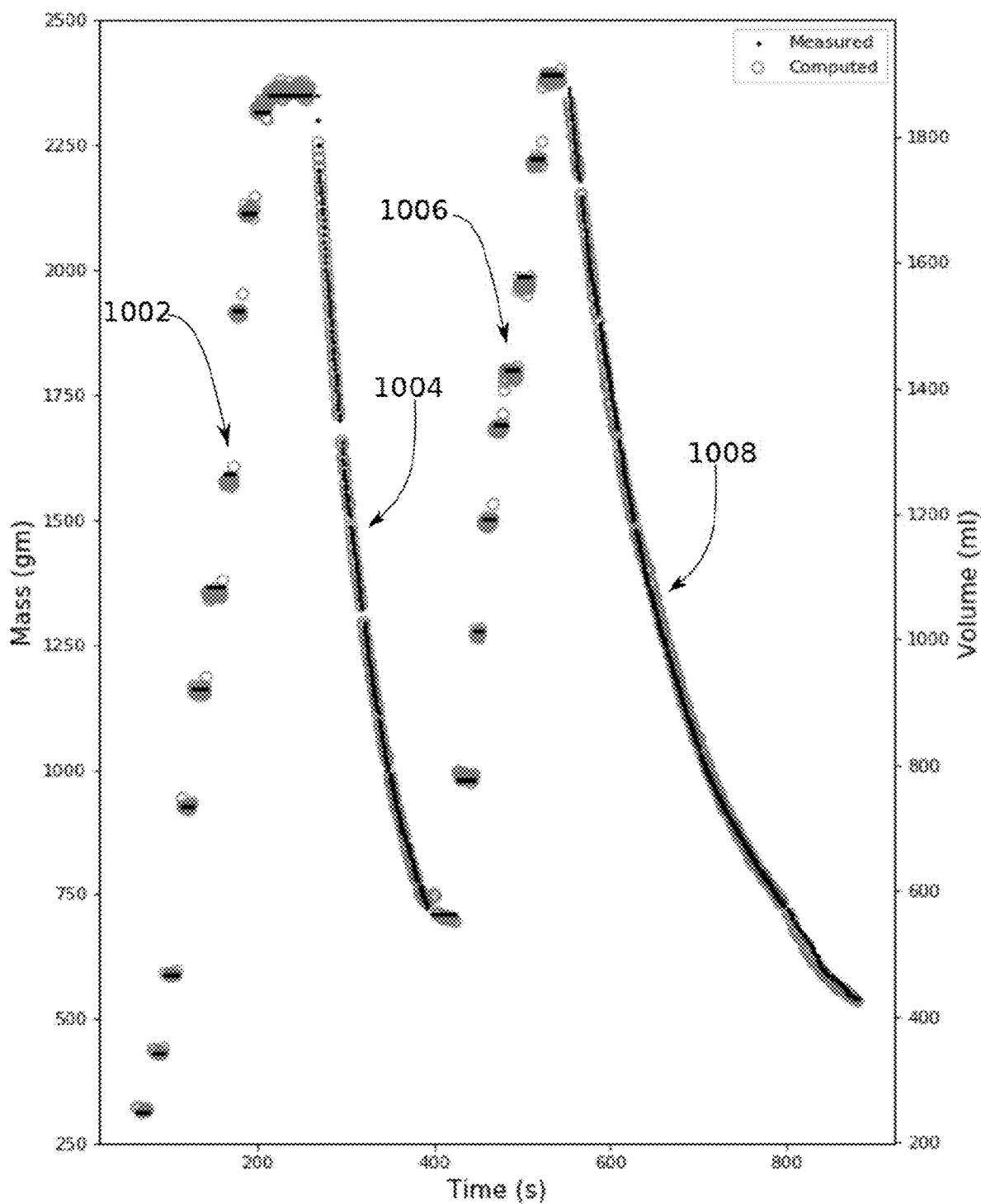
FIG. 10 illustrates an embodiment of a plot of measured and computed mass for a viscous fluid in a tank.

FIG. 10 illustrates an embodiment of a plot of measured and computed mass for a viscous fluid in a tank. In the illustrated embodiment, viscous fluid is glycerin that is added to and then drained from a tank. In other embodiments, other suitable fluids can be used.

In the illustrated embodiment, the capacitive measurement method illustrated in FIG. 5 can be used, and the system 900 illustrated in FIG. 9 can be used where the tank is container 938. The sensing pad unit 926 is attached to an outside wall of container 938. The horizontal x-axis illustrates time (in seconds) and the vertical y-axis illustrates the real-time mass and volume of viscous fluid or substance 936 in the tank or container 938. The measured masses were taken from real-time weight measurements of the container 938 and were taken for each second of time as shown in the x-axis, and volumes calculated assuming a constant density at 20 deg C. of 1.26 gm/cm$^3$. In other embodiments, sensing pad unit 926 can be attached to the inside surface or the interior surface of container 938.

In the illustrated embodiment, computed values were derived from capacitance measurements using system 900 illustrated in FIG. 9. The capacitive sensing pad and discriminating pad unit configuration illustrated in FIG. 3H was used to obtain the capacitive measurements. In the illustrated embodiment, the dimensions of the capacitive sensing pad 392 used was 15 mm by 170 mm, the width of the first inner discriminating pad 393 and the second inner discriminating pad 394 was 3 mm, and the separation between either the first inner discriminating pad 393 or the second inner discriminating pad 394 and the capacitive sensing pad 392 was 1 mm. The width of the first outer discriminating pad 395 and the second outer discriminating pad 396 was 5 mm, and the separation between first outer discriminating pad 395 and the first inner discriminating pad 393, or between the second outer discriminating pad 396 and the second inner discriminating pad 394 was 1 mm. The width is measured in a vertical direction relative to the orientation of the discriminating pad unit configuration illustrated in FIG. 3H.

In the illustrated embodiment, the viscous fluid or substance 936 was added to the tank or container 936 in incremental quantities and one or more capacitive measurements sets were obtained for each mass or volume of substance 936 in container 938. Referring to FIG. 5, a capacitance measurement set is the four capacitive measurements defined in FIG. 5 which are capacitive measurements A at 558, B at 562, C at 566 and D at 570, referred to as capacitive measurement set (A,B,C,D. In various embodiments, the capacitive measurements sets (A,B,C,D) obtained for each mass or volume of substance 936 in container 938 can be one, 10, 20 or 100. In other embodiments, any suitable number of capacitive measure sets (A,B,C,D) can be used.

In order to derive a mathematical relationship between the capacitive measurements sets (A,B,C,D and the mass or volume of substance 936 in container 938, a low order non-linear rational polynomial was derived by taking a subset of the measured data and using commercially available evolutionary search software (Eureqa; www.nutonian.com) (See also, FIG. 6A and FIG. 6B). The computed mass and volume plotted in FIG. 10 are computed by applying the derived formula to the unused subset of capacitive measurements data. The measured masses and volumes are plotted as points, and the computed masses or volumes are plotted as open circles. The container 938 had random masses or volumes of glycerin added. Once container 938 was full, a tap at the base of container 938 was opened to allow the glycerin to drain out. Two cycles of adding and draining glycerin were performed as illustrated in FIG. 10. FIG. 10 illustrates adding substance 938 from zero seconds to 260 seconds at 1002, draining substance 938 from 260 seconds to 425 seconds at 1004, adding substance 938 from 425 seconds to 560 seconds at 1006, and draining substance 938 from 560 seconds to 880 seconds at 1008.

Referring to FIG. 9, the increase in mass or volume of substance 936 per unit increase in height 948 (e.g., in centimeters of substance 936 between the bottom 942 and level 944 is greater than the increase in mass or volume of substance adhesion layer 940 per unit increase in height 948 (e.g., in centimeters between the bottom 944 and top 946 because substance 936 fills the entire volume of container 938 between level 944 and bottom 942 while the substance adhesion layer 940 between level 944 and level 946 does not.

Referring to FIG. 10, the vertical y-axis values for computed mass or volume were obtained by measuring or taking a number of capacitive measurement sets (A,B,C,D) as described above and deriving a mathematical relationship or equation between a subset of the number of capacitive measurement sets (A,B,C,D) and the measured or known mass or volume. In various embodiments, a subset of the number of capacitive measurement sets (A,B,C,D) can be half of the number of capacitive measurement sets (A,B,C,D) such that if the number of capacitive measurement sets (A,B,C,D) is 10 or 20, the subset would be, respectively 5 or 10 measurement results. In other embodiments, the subset of the overall number of capacitive measurement sets (A,B,C,D) used to derive the mathematical relationship, formula or equation can be 10%, 90%, or any other suitable number of the overall number of capacitive measurement sets (A,B,C,D) used to derive the mathematical relationship, formula or equation. In these embodiments, the capacitive measurement sets (A,B,C,D) that were not part of the subset are used to validate the mathematical relationship, formula or equation. In these embodiments, the capacitive measurement sets (A,B,C,D) that were not part of the subset were used to generate the computed mass or volume illustrated in FIG. 10 in order to validate the mathematical relationship, formula or equation. In other embodiments, the entire number of capacitive measurement sets (A,B,C,D) are used to derive a mathematical relationship, formula or equation and a second set of capacitive measurement sets (A,B,C,D) are taken to validate the mathematical relationship, formula or equation.

In the illustrated embodiment, the subset of the number of capacitive measurement sets (A,B,C,D) are used to determine a mathematical relationship, formula or equation that enables the subset of the number of capacitive measurement sets (A,B,C,D) as inputs to the mathematical relationship, formula or equation to define or approximate the known or measured mass or volume as an output of the mathematical relationship, formula or equation. The capacitive measurement sets (A,B,C,D) that were not part of the subset were used to generate the computed mass or volume illustrated in FIG. 10 in order to validate the mathematical relationship, formula or equation. The polynomial equation uses as inputs the capacitive measurement sets and provides outputs that approximate the mass or volume as illustrated in FIG. 10.

In the illustrated embodiment, n conductive discriminating pads were used where n=2 in order to obtain the capacitive measurement set (A,B,C,D). In other embodiments, n=1 for a capacitive measurement set (A,B) or n≥3 such as for n=3 to obtain 8 capacitive measurements for a capacitive measurement set (A,B,C,D,E,F,G,H) can be used. In other embodiments, any suitable number of n can be used to obtain the capacitive measurement set.

FIG. 10 illustrates that by using capacitive measurement sets (A,B,C,D) with sensing pad unit 926 as inputs to the equation as discussed above, a mass and volume of a viscous fluid or particulate illustrated as substance 936 and including the mass and volume in the viscous layer 940 can be accurately measured. In various embodiments, the substance 936 in container 938 may be a liquid or a solid particulate.

In the illustrated embodiments of FIG. 10, there may be a non-negligible background capacitance that exists even when there is no water in the tank or container, for example due to parasitic capacitance in the sensing pad unit 126, or to the capacitive effects of the physical installation of the sensor system 900, and it may be necessary to perform a baseline measurement of this background capacitance for each configuration of the discriminating pads, and then use these values to remove the background reading from further measurements. Consequently there will be 4 baseline values. These baseline values correspond to measurement configurations which are: measurement A: {S, S}; measurement B: {G, G}; measurement C: {S, G}; measurement D: {G, S}. Typical methods of establishing a baseline are to compute the mean or the median of a set of measurements taken in the absence of a proximate object.

Figure 11:
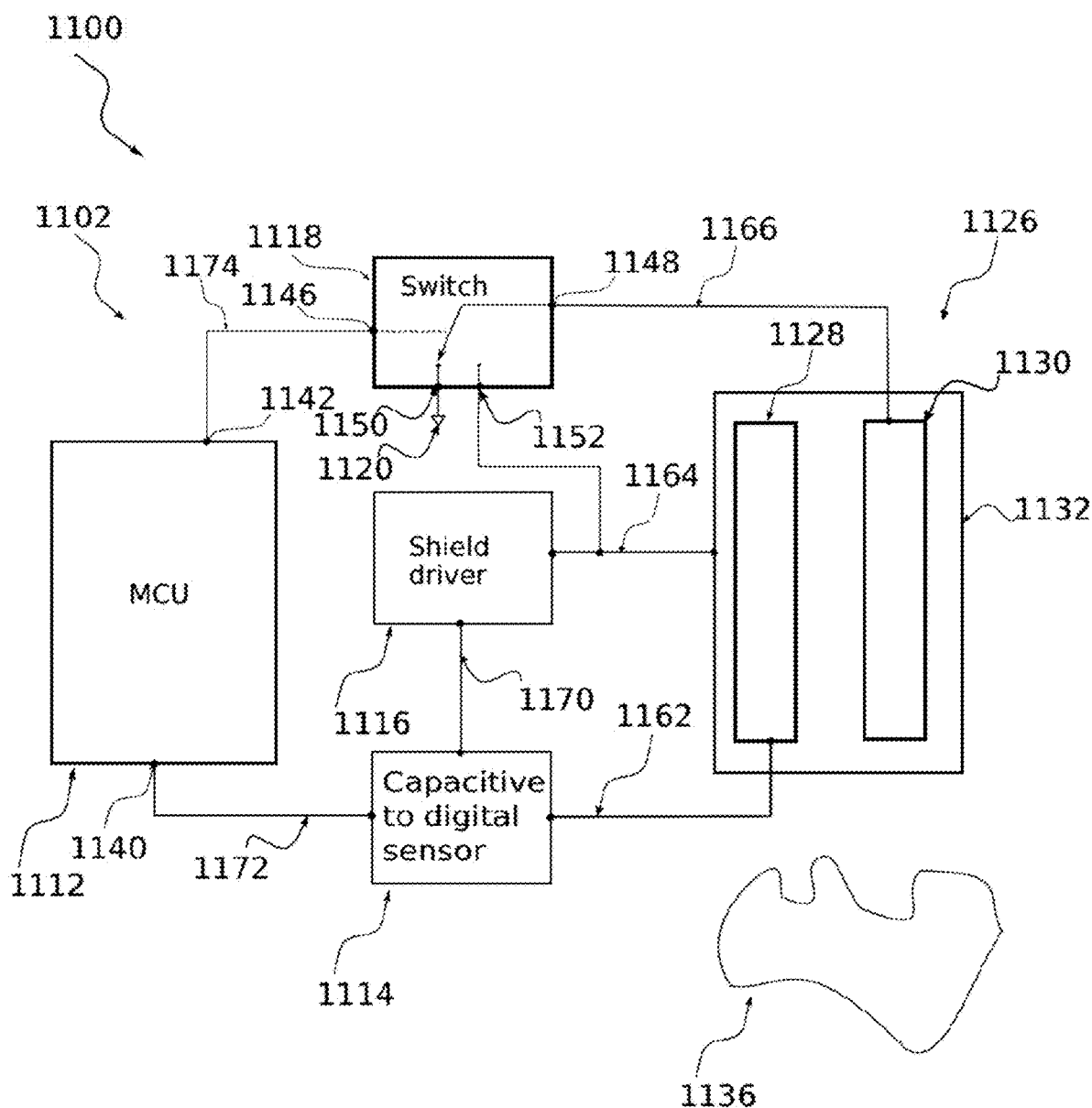
FIG. 11 illustrates an embodiment of a system which includes a sensor measurement system and a sensing pad unit.

FIG. 11 illustrates an embodiment of a system 1100 which includes a sensor measurement system 1102 and a sensing pad unit 1126. Sensor measurement system 1102 includes a control unit 1112, a capacitive to digital sensor 1114, a shield driver 1116, a single-pole double-throw switch 1118. Sensing pad unit 1126 includes a capacitive sensing pad 1128, a proximate discriminating pad 1130 and a shield 1132. A proximate object or substance 1136 is illustrated in proximity to sensing pad unit 1126. The capacitive to digital sensor 1114 is connected via conductive line 1162 to the capacitive sensing pad 1128, and is connected via conductive line 1170 to the input of the shield driver 1116. The input 1146 of switch 1118 is controlled by the control unit 1112. The output of the shield driver 1116 is connected to the shield pad 1132 via conductive line 1164.

In the illustrated embodiment, control unit 1112 is a micro-controller or micro-controller unit (MCU). In different embodiments, the control unit 1112 and the capacitive to digital sensor 1114 may be separate integrated circuit chips or they may be incorporated into the same integrated circuit chip. Furthermore, in different embodiments, shield driver 1116 and the capacitive to digital sensor 1114 may be separate integrated circuit chips or they may be incorporated into the same integrated circuit chip.

The control unit 1112 uses methods of digital interfacing to control the functioning of the capacitive to digital sensor 114. If the control unit 1112 and the capacitive to digital sensor 1114 are separate physical chips then these interface methods can include, but are not limited to, I²C (also known as Inter-Integrated Circuit) and SPI (also known as Serial Peripheral Interface). In the illustrated embodiment, capacitive to digital sensor 1114 is coupled to communication interface 1140 via multiwire conductive lines 1172. The connection to communication interface 1140 can be I²C (2 wire), SPI (4 wire), or can be another suitable type of connection.

In the illustrated embodiment, the capacitance sensing pad 1128, the discriminating pad 1130 and shield pad 1132 are constructed of conductive materials such as metals. By way of example, this can include a printed circuit board, a flex-PCB, copper tape, or conductive cloth, but can also be any other conductive substance.

In the illustrated embodiment, shield driver 1116 is electrically connected to shield pad 1132 via conductive line 1164, and shield driver 1116 drives shield pad 1132 to the same voltage potential as capacitive sensing pad 1128. Therefore, there is no electric field between the capacitive sensing pad 1128 and the shield pad 1132. Consequently, any capacitive effect of a material behind the shield pad 1132 on a capacitance measurement by capacitance to digital sensor 1114 is nullified. In usage, the shield pad 1132 is used to provide directional sensitivity to the capacitive sensing pad 1128 and to limit the capacitive effects of material behind the shield pad 1132. In the illustrated embodiment, the shield pad 1132 is placed in close proximity to the capacitive sensing pad 1128, typically a distance of a few tenths of a millimeter up to a few millimeters. In other embodiments, other suitable spacing can be used.

In various embodiments, shield pad 1132 may have a separate physical construction than the capacitive sensing pad 1128 and the discriminating pad 1130, or shield pad 1132 can be within the substrate of capacitive sensing pad 1128 and discriminating pad 1130, such as with a multilayer printed circuit board.

The size and shape of the capacitive sensing pad 1128 and the discriminating pad 1130 will depend on the particular application. For example, if it is necessary that the capacitive sensing pad 1128 be sensitive to distant objects such as a proximate object or substance 1136 that is spaced apart from capacitive sensing pad 1128 by a large distance, then the capacitive sensing pad 1128 should be larger than a capacitive sensing pad 1128 designed for sensitivity to closer objects such as a proximate object or substance 1136 that is spaced apart from capacitive sensing pad 1128 by a distance that is less than the large distance.

In the illustrated embodiment, with regard to the switch 1118, switch 1118 may be a solid state type switch. In the illustrated embodiment, switch 1118 is controlled via a digital interface from control unit 1112, and this interface can be an Input/Output (I/O) line set to either a digital high (H) or a digital low (L). In other embodiments, other suitable ways to control switch 1118 may be used.

In the illustrated embodiment, the input terminal 1146 of the first switch 1118 is electrically connected to I/O terminal 1142 of the control unit 1112 via conductive line 1174. The common node 1148 of the first switch 1118 is electrically connected to the first discriminating pad 1130 via conductive line 1166. One output terminal 1150 of the first switch 1118 is connected to a ground potential at 1120, and the other output terminal 1152 is connected to the output of the shield driver 1116 via conductive line 1164.

The switch 1118 is controlled by control unit 1112 and control unit 1112 can set the input terminal 1146 of switch 1118 to the appropriate value of H or L. It is understood that the specifics of this will depend on the chosen implementation of the switch 1118, and that the order of the switching is not important to the method.

If we write in shorthand {X} where X represents the connection state of the first switch 1118, where the connection state can take the values of either "S" or "G" which represents the state when the first switch 1118 connects the first discriminating pad 1130 to the output of the shield driver 1116 via conductive line 1164 ("S") or to a ground connection 1120 ("G"). Then the possible measurement configurations can be written as: measurement A: {S}; measurement B: {G}. At the end of a single measurement cycle, there will be 2 capacitive measurements corresponding to all possible configurations of the discriminating pad connections. The capacitive measurements at the end of the single measurement cycle will be hereafter referred to as a "measurement set" (e.g., capacitive measurement set (A,B)).

In the illustrated embodiment, switching discriminating pad 1130 between the ground connection 1120 and the output of shield driver 1116 via conductive line 1164 results in a change in the electric field lines between the capacitive sensing pad 1128 and the proximate object 1136, resulting in 2 different capacitive measurements. The degree to which these measurements change will also be dependent on the type of substance or object, its shape, and its distance from the sensing pad unit. Consequently, these measurements may be used to distinguish between and/or identify different objects or substances 1136, or may be used to determine the properties of the object or substance 1136.

In the illustrated embodiment, to determine the relationship between the proximate object 1136 and the capacitive measurements, a set of sample measurements for each of a range of objects and substances that are of interest are taken and the sample set of measurement sets analyzed using data analysis techniques. In the illustrated embodiment, the application of one or more methods of Machine Learning or numerical optimization can be used. These methods include, but are not limited to, Neural Networks, Decision Trees and its variants, Nearest Neighbor algorithms, or Linear Discriminant Analysis, evolutionary search, genetic algorithms, high dimensional splines, and linear and non-linear optimization. In other embodiments, visual inspection of the set of sample measurements can be used.

As there may be a non-negligible background capacitance that exists even when there is no proximate object 1136, for example due to parasitic capacitance in the sensing pad unit 1126, or to the capacitive effects of the physical installation of the sensor system 1100, it may be necessary to perform a baseline measurement of this background capacitance for each configuration of the discriminating pads, and then use these values to remove the background reading from further measurements. Consequently there will be 2 baseline values. These baseline values correspond to measurement configurations which are: measurement A: {S}; measurement B: {G}. Typical methods of establishing a baseline are to compute the mean or the median of a set of measurements taken in the absence of a proximate object.

Figure 12:
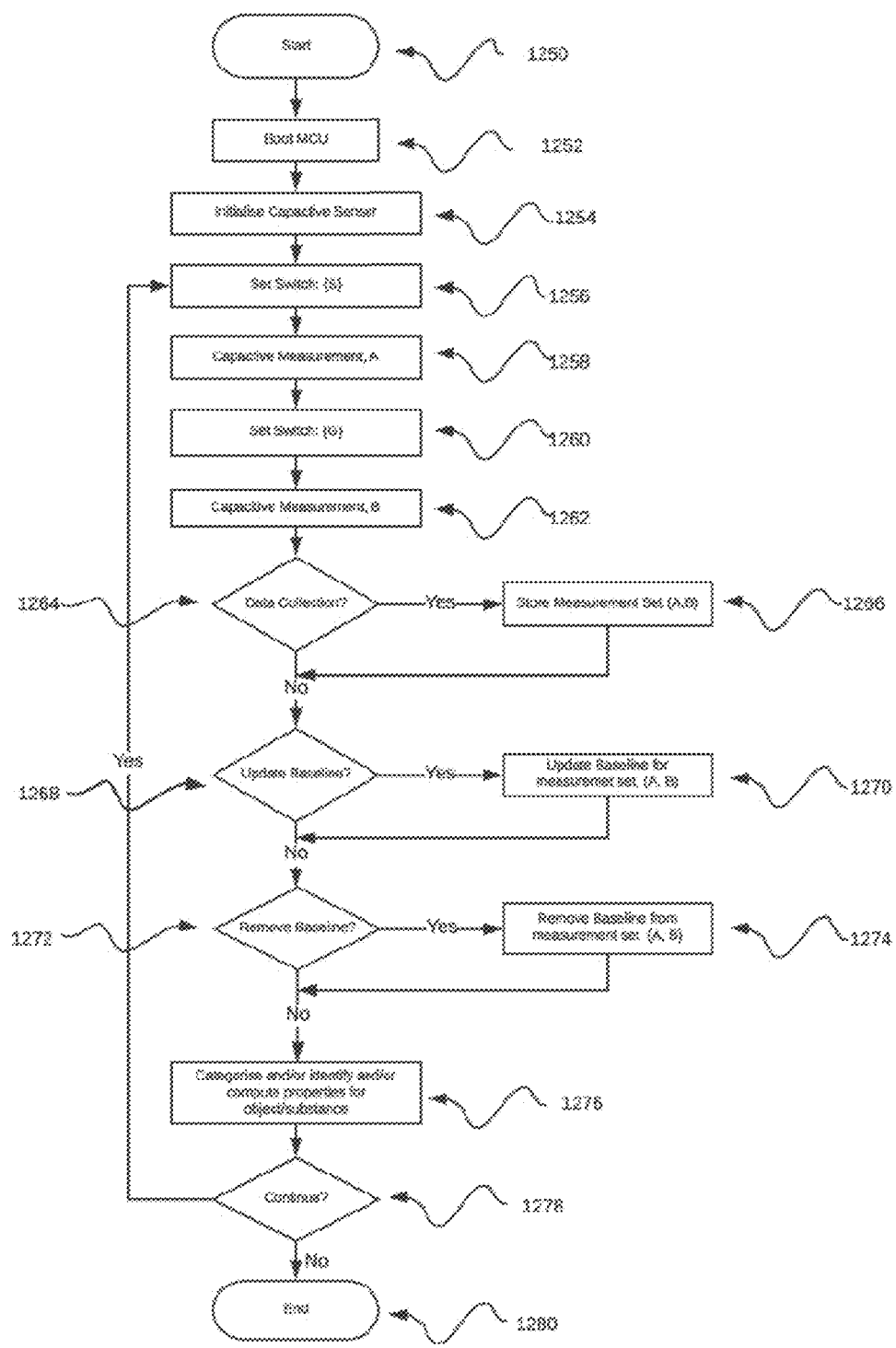
FIG. 12 illustrates a flow chart of an embodiment of a measurement process.

FIG. 12 illustrates a flow chart of an embodiment of a measurement process. On startup 1250, the control unit 1112 performs its initialization process 1252. The capacitive to digital sensor 1114 performs its initialization process 1254 with the measurement parameters set by the control unit 1112. These parameters are specific to each capacitive sensor but may include parameters like measurement rate, channel number, method of offset, and accuracy. The first switch 1118 is set to state {S} at 1256. A capacitive measurement, A, is made at 1258. The first switch 1118 is set to state {G} at 1260. A second capacitive measurement, B, is made 1262.

If these measurement are part of a data collection process at 1264, such as to be used as sample data for a Machine Learning analysis, then the data is stored at 1266 for later transfer to a memory device.

If these measurements are part of a baseline process at 1268, then the baseline is calculated and updated at 1270. If the baseline is to be removed from the measurement at 1272, then the baseline is removed at 1274. If categorization or identification of the object or material is required, or if the computation of material properties is required, then the categorization/computational process is implemented at 1276. If the process continues at 1278, then the process returns to the switch process settings at 1256, otherwise the process halts at 1280.

FIGS. 13A-13E illustrate top views of embodiments of a sensing pad unit. FIG. 3A illustrates a plan view of a substantially rectangular capacitive pad 1300 with a discriminating pad 1302 in nearby proximity, and with a shield pad 1304 underneath. This configuration of capacitive sensing pad 1300 and discriminating pad 1302 is asymmetrical. The separation of the discrimination pad and the capacitive sensing pad is generally of the order of, or smaller then, the dimensions of the capacitive sensing pad.

Figure 13A:
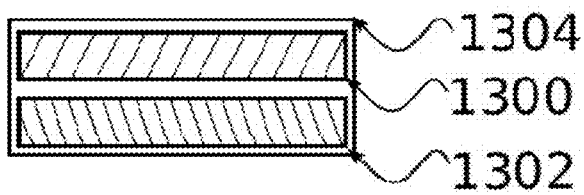
FIGS. 13A-13E illustrate top views of embodiments of a sensing pad unit.
Figure 13B:
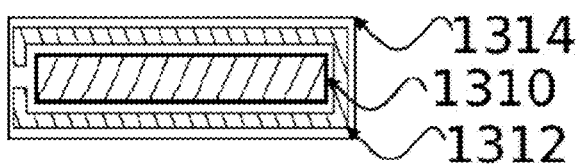

FIG. 13B illustrates a plan view of a symmetrical arrangement, comprising a substantially rectangular capacitive sensing pad 1310, a discriminating pad 1312 substantially surrounding the capacitive pad, and a shield pad 1414 underneath.

Figure 13C:
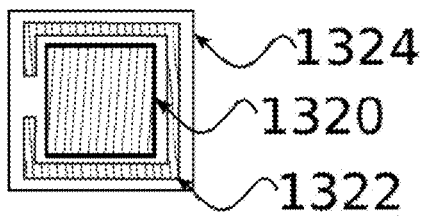

FIG. 13C illustrates a plan view of a substantially square capacitive pad 1320, substantially surrounded by a discriminating pad 1322 in a symmetrical arrangement and a shield pad 1324 underneath.

Figure 13D:
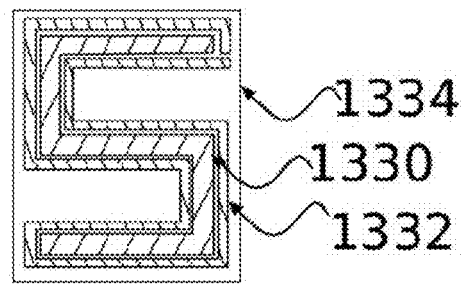

FIG. 13D illustrates a plan view of an S shaped capacitive sensing pad 1330 substantially surrounded by a discriminating pad 1332 in a symmetrical arrangement, and a shield pad 1334 underneath.

Figure 13E:
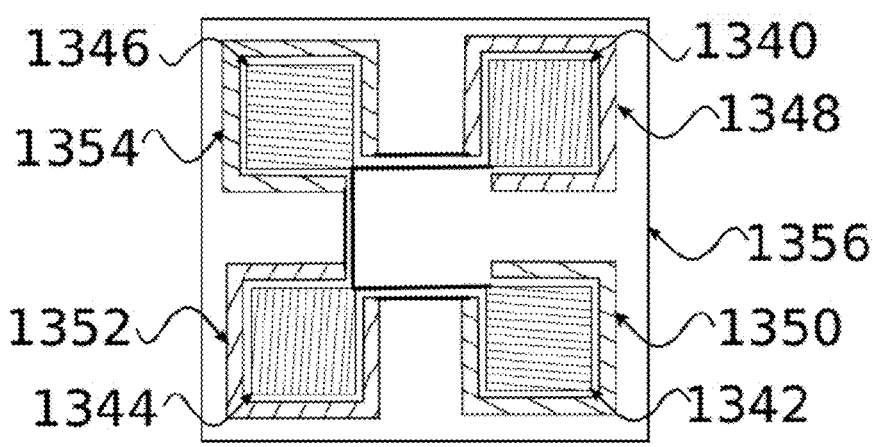

FIG. 13E illustrates a plan view of a grid of 4 substantially square pads 1340, 1342, 1344, and 1346, each surrounded by a discriminating pad 1348, 1350, 1352 and 1354 and a shield pad 1356 underneath. The capacitive pads are electrically connected together. The discrimination pads are electrically connected together.

In various embodiments of sensing pad units illustrated in FIGS. 13A-13E, the shield pad has a size and shape that is equal to or greater than the capacitive sensing pad, and may be large in extent or area so as to include or be underneath the outermost discriminating pad. In various embodiments of sensing pad units, the separation between the capacitive sensing pad and the shield pad should be less than the smallest dimension of the capacitive sensing pad. For example, in FIG. 13A the separation between the capacitive sensing pad 1300 and the shield pad 1304 should be less than the width of the capacitive sensing pad 1300. In various embodiments, the minimum dimension can be a length or width when the capacitive sensing pad has a rectangular shape or can be a diameter when the capacitive sensing pad has a disc or circular shape.

FIG. 14 illustrates a plot of embodiments of capacitive measurements A vs (A-B) for a variety of objects and substances. The data points illustrated in FIG. 14 were obtained using the capacitive sensing pad 1320 illustrated in FIG. 13C, the sensor measurement system 1102 illustrated in FIG. 11, and the measurement method illustrated in FIG. 12. The measurement method illustrated in FIG. 12 was used to obtain capacitive measurements sets (A,B). The vertical y-axis illustrates measurement A minus measurement B (e.g., measurement B subtracted from measurement A), and the horizontal x-axis illustrates measurement A. The objects and materials tested were rice, bottles of water of various quantities, aluminum granules, mobile phones of various sizes, books of various sizes, lead granules and wheat. For rice, aluminum granules, lead granules and wheat, the quantities measured were increased in centiliter (cl) units from 4 cl to 40 cl. FIG. 14 illustrates a separation between different materials and different object types. The separations depends on the composition, size, shape and quantity of the material/object. Other classes of objects and other materials will occupy other areas in a plot of A vs (A-B). FIG. 14 illustrates a separation in an increasing vertical direction of the y-axis between, lead granules (bottom), aluminum granules, rice and wheat (top) based on quantity. FIG. 14 further illustrates a separation in an increasing horizontal direction of the x-axis between wheat (first), rice (second), aluminum granules (third) and lead granules (fourth) based on quantity. In the embodiments illustrated herein, these separations enable identification of both the quantity of material and the type of material.

In the illustrated embodiment, the dimensions of the capacitive sensing pad 1320 was 2 cm on a side, the width of the discriminating pad 1322 was 5 mm and the and the separation between the capacitive sensing pad 1320 and the discriminating pad 1322 was 1 mm. separation between two pads was 1 mm.

In other embodiments, measurements A and B of measurement set (A,B) can be combined in a variety of suitable ways to obtain optimal separation of the desired substances. In various embodiments, values obtained for measurement set (A,B) will depend on the configuration of system 1100 including the configuration of the sensing pad unit 1126, and on the specifics of the proximate object 1136, such as, but not limited to, size, shape, temperature and physical form.

Figure 15:
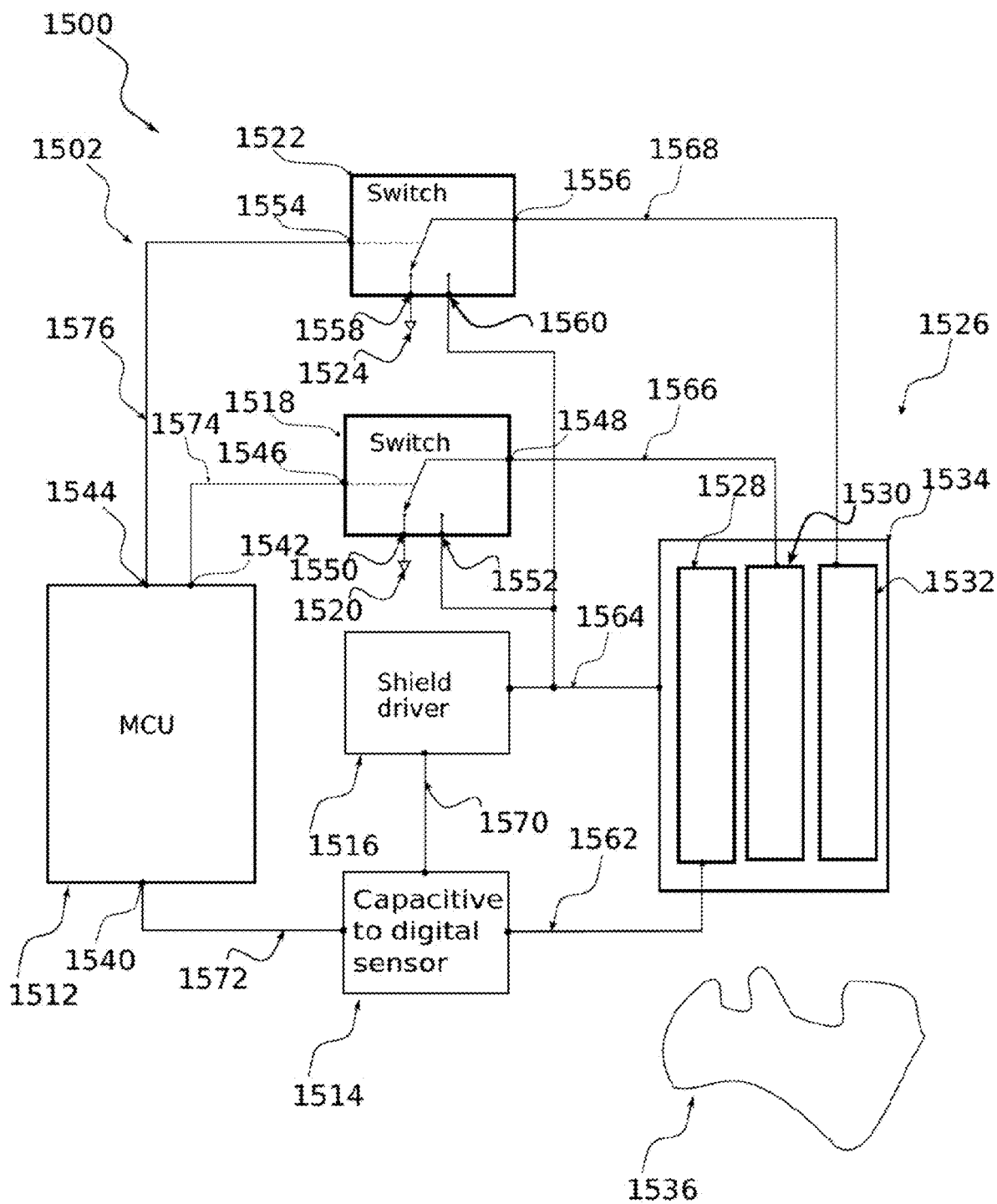
FIG. 15 illustrates an embodiment of a system which includes a sensor measurement system and a sensing pad unit.

FIG. 15 illustrates an embodiment of a system 1500 which includes a sensor measurement system 1502 and a sensing pad unit 1526. Sensor measurement system 1502 includes a control unit 1512, a capacitive to digital sensor 1514, a shield driver 1516, a single-pole double-throw switch 1518 and a second single-pole double-throw switch 1522. Sensing pad unit 1526 includes a capacitive sensing pad 1528, a proximate discriminating pad 1530, a second proximate discriminating pad 1532 and a shield 1534. A proximate object or substance 1536 is illustrated in proximity to sensing pad unit 1526. The capacitive to digital sensor 1514 is connected via conductive line 1562 to the capacitive sensing pad 1528, and is connected via conductive line 1570 to the input of the shield driver 1516. The inputs 1546 and 1554 of the respective switches 1518 and 1522 are controlled by the control unit 1512. The output of the shield driver 1516 is connected to the shield pad 1534 via conductive line 1564.

In the illustrated embodiment, control unit 1512 is a micro-controller or micro-controller unit (MCU). In different embodiments, the control unit 1512 and the capacitive to digital sensor 1514 may be separate integrated circuit chips or they may be incorporated into the same integrated circuit chip. Furthermore, in different embodiments, shield driver 1516 and the capacitive to digital sensor 1514 may be separate integrated circuit chips or they may be incorporated into the same integrated circuit chip.

The control unit 1512 uses methods of digital interfacing to control the functioning of the capacitive to digital sensor 1514. If the control unit 1512 and the capacitive to digital sensor 1514 are separate physical chips then these interface methods can include, but are not limited to, I²C (also known as Inter-Integrated Circuit) and SPI (also known as Serial Peripheral Interface). In the illustrated embodiment, capacitive to digital sensor 1514 is coupled to communication interface 1540 via multiwire conductive lines 1572. The connection to communication interface 1540 can be I²C (2 wire), SPI (4 wire) or can be another suitable type of connection.

In the illustrated embodiment, the capacitance sensing pad 1528, the discriminating pads 1530 and 1532, and shield pad 1534, are constructed of conductive materials such as metals. By way of example, this can include a printed circuit board, a flex-PCB, copper tape, or conductive cloth, but can also be any other conductive substance.

In the illustrated embodiment, shield driver 1516 is electrically connected to shield pad 1534 via conductive line 1564, and shield driver 1516 drives shield pad 1534 to the same voltage potential as capacitive sensing pad 1528. Therefore, there is no electric field between the capacitive sensing pad 1528 and the shield pad 1534. Consequently, any capacitive effect of a material behind the shield pad 1534 on a capacitance measurement by capacitance to digital sensor 1514 is nullified. In usage, the shield pad 1534 is used to provide directional sensitivity to the capacitive sensing pad 1528 and to limit the capacitive effects of material behind the shield pad 1534. In the illustrated embodiment, the shield pad 1534 is placed in close proximity to the capacitive sensing pad 1528, typically a distance of a few tenths of a millimeter up to a few millimeters. In other embodiments, other suitable spacing can be used.

In various embodiments, shield pad 1534 may have a separate physical construction than the capacitive sensing pad 1528 and the discriminating pads 1530 and 1532, or shield pad 1534 can be within the substrate of capacitive sensing pad 1528, and discriminating pads 1530 and 1532, such as with a multilayer printed circuit board.

The size and shape of the capacitive sensing pad 1528 and the discriminating pads 1530 and 1532 will depend on the particular application. For example, if it is necessary that the capacitive sensing pad 1528 be sensitive to distant objects such as a proximate object or substance 1536 that is spaced apart from capacitive sensing pad 1528 by a large distance, then the capacitive sensing pad 1528 should be larger than a capacitive sensing pad 1528 designed for sensitivity to closer objects such as a proximate object or substance 1536 that is spaced apart from capacitive sensing pad 1528 by a distance that is less than the large distance.

In the illustrated embodiment, with regard to the switches 1518 and 1522, switches 1518 and 1522 may be a solid state type switch. In the illustrated embodiment, switches 1518 and 1522 are controlled via a digital interface from control unit 1512, and this interface can be an Input/Output (I/O) line set to either a digital high (H) or a digital low (L). In other embodiments, other suitable ways to control switches 1518 and 1522 may be used.

In the illustrated embodiment, the input terminal 1546 of the first switch 1518 is electrically connected to I/O terminal 1542 of the control unit 1512 via conductive line 1574. The common node 1548 of the first switch 1518 is electrically connected to the first discriminating pad 1530 via conductive line 1566. One output terminal 1550 of the first switch 1518 is connected to a ground potential at 1520, and the other output terminal 1552 is connected to the output of the shield driver 1516 via conductive line 1564. The input terminal 1554 of the second switch 1522 is electrically connected to I/O terminal 1544 of the control unit 1512 via conductive line 1576. The common node 1556 of the switch 1522 is connected to the second discriminating pad 1532 via conductive line 1568. One output terminal 1558 of the switch 1522 is connected to a ground potential at 1524, the other output terminal 1560 is connected to the output of the shield driver 1516 via conductive line 1564.

The switches 1518 and 1522 are controlled by control unit 1512 and control unit 1512 can set the input terminals 1546 and 1554 of respective switches 1518 and 1522 to the appropriate value of H or L. It is understood that the specifics of this will depend on the chosen implementation of the switches 1518 and 1522, and that the order of the switching is not important to the method.

If we write in shorthand {X,Y} where X and Y represent the connection state of the first switch 1518 and the second switch 1522 respectively, where the connection state can take the values of either "S" or "G" which representing the state when the first switch 1518 or the second switch 1522 connects respectively the first discriminating pad 1530 or the second discriminating pad 1532 to either the output of the shield driver 1516 via conductive line 1564 ("S"), or to respective ground connections 1520 and 1524 ("G"). Then the possible measurement configurations can be written as: measurement A: {S, S}; measurement B: {G, G}; measurement C: {S, G}; measurement D: {G, S}. At the end of a single measurement cycle, there will be 4 capacitive measurements corresponding to all possible configurations of the discriminating pad connections. The capacitive measurements at the end of the single measurement cycle will be hereafter referred to as a "measurement set" (e.g., capacitive measurement set (A,B,C,D)).

In the illustrated embodiment, switching discriminating pads 1530 and 1532 between respective ground connections 1520 and 1524 and the output of shield driver 1516 via conductive line 1564 results in a change in the electric field lines between the capacitive sensing pad 1528 and the proximate object 1536, resulting in 4 different capacitive measurements. The degree to which these measurements change will also be dependent on the type of substance or object, its shape, and its distance from the sensing pad unit. Consequently, these measurements may be used to distinguish between and/or identify different objects or substances 1536, or may be used to determine the properties of the object or substance 1536.

In the illustrated embodiment, to determine the relationship between the proximate object 1536 and the capacitive measurements, a set of sample measurements for each of a range of objects and substances that are of interest are taken and the sample set of measurement sets analyzed using data analysis techniques. In the illustrated embodiment, the application of one or more methods of Machine Learning or numerical optimization can be used. These methods include, but are not limited to, Neural Networks, Decision Trees and its variants, Nearest Neighbor algorithms, or Linear Discriminant Analysis, evolutionary search, genetic algorithms, high dimensional splines, and linear and non-linear optimization. In other embodiments, visual inspection of the set of sample measurements can be used.

As there may be a non-negligible background capacitance that exists even when there is no proximate object 1536, for example due to parasitic capacitance in the sensing pad unit 1526, or to the capacitive effects of the physical installation of the sensor system 1500, it may be necessary to perform a baseline measurement of this background capacitance for each configuration of the discriminating pads, and then use these values to remove the background reading from further measurements. Consequently there will be 4 baseline values. These baseline values correspond to measurement configurations which are: measurement A: {S, S}; measurement B: {G, G}; measurement C: {S, G}; measurement D: {G, S}. Typical methods of establishing a baseline are to compute the mean or the median of a set of measurements taken in the absence of a proximate object.

Figure 16A:
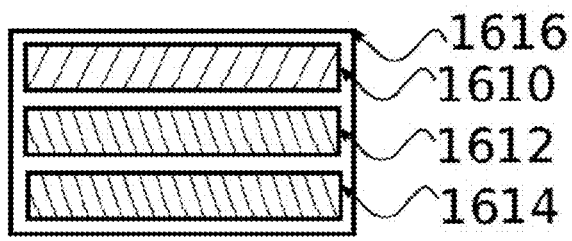
FIGS. 16A-16E illustrate top views of embodiments of a sensing pad unit.

FIGS. 16A-16E illustrate plan or top views of embodiments of a sensing pad unit. FIG. 16A illustrates a plan view of a substantially rectangular capacitive sensing pad 1610, with a substantially rectangular discriminating pad 1612 in nearby proximity, a second substantially rectangular discriminating pad 1614 in nearby proximity, and a shield 1616 underneath. This configuration of capacitive pad and discriminating pad is asymmetrical.

Figure 16B:
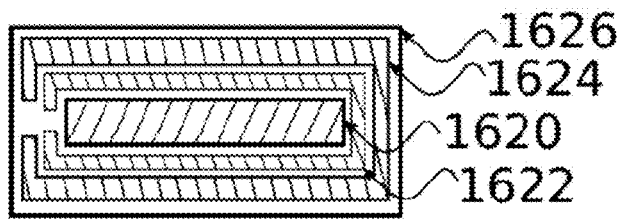

FIG. 16B illustrates a plan view of a symmetrical arrangement, comprising a substantially rectangular capacitive sensing pad 1620, a first discriminating pad 1622 substantially surrounding the capacitive sensing pad 1620, a second discriminating pad 1624 substantially surrounding the capacitive sensing pad 1620 and the first discriminating pad 1622, and a shield pad 1626 underneath the capacitive sensing pad 1620, first discriminating pad 1622 and second discriminating pad 1624. In the illustrated embodiment, shield pad 1626, underneath the capacitive sensing pad 1620, reduces the sensitivity of capacitance measurements made using the capacitive sensing pad 1620 to capacitance effects caused by material behind the shield pad 306.

Figure 16C:
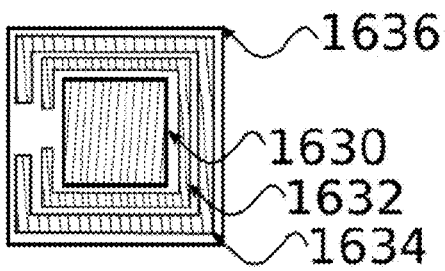

FIG. 16C illustrates a plan view of a symmetrical arrangement, comprising a substantially rectangular capacitive sensing pad 1630, a first discriminating pad 1632 substantially surrounding the capacitive sensing pad 1630, a second discriminating pad 1634 substantially surrounding the capacitive sensing pad 1630 and the first discriminating pad 1632, and a shield pad 1636 underneath the capacitive sensing pad 1630, first discriminating pad 1632 and second discriminating pad 1634. In the illustrated embodiment, shield pad 1636, underneath the capacitive sensing pad 1630, reduces the sensitivity of capacitance measurements made using the capacitive sensing pad 1630 to capacitance effects caused by material behind the shield pad 1636.

Figure 16D:
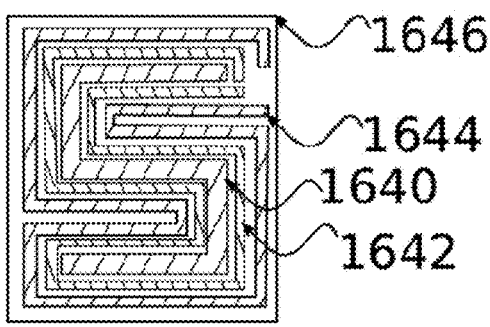

FIG. 16D illustrates a plan view of an "S" shaped arrangement, comprising an S-shaped capacitive sensing pad 1640, a first discriminating pad 1642 substantially surrounding the capacitive sensing pad 1640, a second discriminating pad 1644 substantially surrounding the capacitive sensing pad 1640 and the first discriminating pad 1642, and a shield pad 1646 underneath the capacitive sensing pad 1640, first discriminating pad 1642 and second discriminating pad 1644. In the illustrated embodiment, shield pad 1646, underneath the capacitive sensing pad 1640, reduces the sensitivity of capacitance measurements made using the capacitive sensing pad 1640 to capacitance effects caused by material behind the shield pad 1646.

Figure 16E:
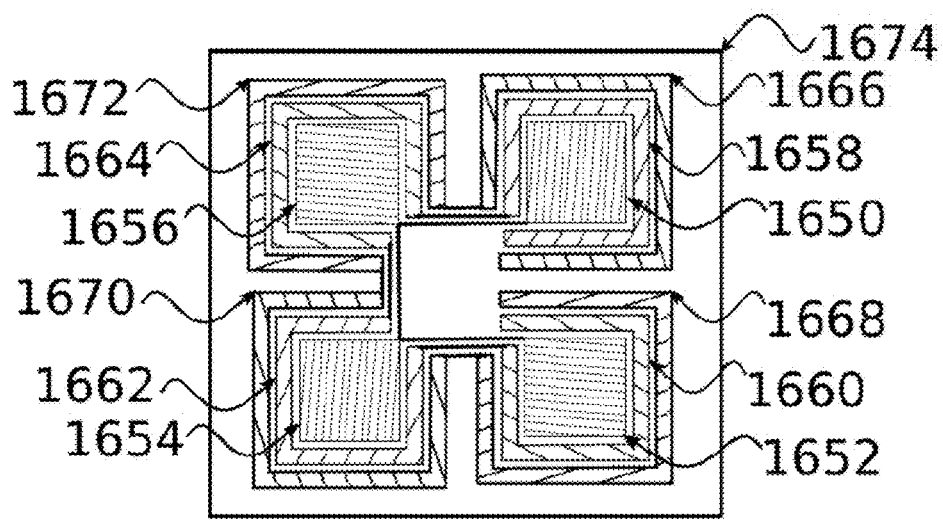

FIG. 16E illustrates a plan view of a grid of four substantially square capacitive sensing pads 1650, 1652, 1654 and 1656, each substantially surrounded by a respective inner discriminating pad 1658, 1660, 1662 and 1664, and a respective outer discriminating pad 1666, 1668, 1670 and 1672, and a shield pad 1674 underneath the capacitive sensing pads 1650, 1652, 1654 and 1656, the inner discriminating pads pad 1658, 1660, 1662 and 1664 and the outer discriminating pads 1666, 1668, 1670 and 167. The capacitive sensing pad 1650 and its surrounding discriminating pads 1658 and 1666 comprise a first sub unit. The capacitive sensing pad 1652 and its surrounding discriminating pads 1660 and 1668 comprise a second sub unit. The capacitive sensing pad 1654 and its surrounding discriminating pads 1662 and 1670 comprise a third sub unit. The capacitive sensing pad 1656 and its surrounding discriminating pads 1664 and 1666 comprise a fourth sub unit.

FIG. 17 illustrates a plot of embodiments of capacitive measurements (A-B) vs (B-C) for a variety of objects and substances. The data points illustrated in FIG. 17 were obtained using the capacitive sensing pad 1630 illustrated in FIG. 16C, the sensor measurement system 1502 illustrated in FIG. 15, and the measurement method illustrated in FIG. 2. The measurement method illustrated in FIG. 2 was used to obtain capacitive measurements sets (A,B,C,D). The vertical y-axis illustrates measurement B minus measurement C (e.g., measurement C subtracted from measurement B), and the horizontal x-axis illustrates measurement A minus measurement B (e.g., measurement B subtracted from measurement A). The objects and materials tested were rice, bottles of water of various quantities, aluminum granules, mobile phone of various size, book of various sizes, lead granules and wheat. For rice, aluminum granules, lead granules and wheat, the quantities measured were increased in centiliter (cl) units from 4 cl to 40 cl. FIG. 17 illustrates a separation between different materials and different object types. The separations depends on the composition, size, shape and quantity of the material/object. Other classes of objects and other materials will occupy other areas in a plot of (A-B) vs (B-C). In other embodiments and in plots of other combinations of capacitive measurements such as (A/C) vs (C-D), the form of separation may be different. FIG. 17 illustrates a separation in an increasing vertical direction of the y-axis between wheat (bottom), rice, aluminum granules and lead granules (top). FIG. 17 further illustrates a separation in an increasing horizontal direction of the x-axis between wheat (first), rice (second), aluminum granules (third) and lead granules (fourth) based on quantity. In the embodiments illustrated herein, these separations enable identification of both the quantity of material and the type of material.

In the illustrated embodiment, the dimensions of the capacitive sensing pad 1630 was 2 cm on a side, the width of the inner discriminating pad 1632 was 5 mm, and the separation between the capacitive sensing pad 1320 and the inner discriminating pad 1322 was 1 mm. The width of the outer discriminating pad 1634 was 10 mm, and the separation between inner discriminating pad 1322 and the outer discriminating pad 1634 was 1 mm.

In other embodiments, measurements A and B of measurement set (A,B,C,D) can be combined in a variety of suitable ways to obtain optimal separation of the desired substances. In various embodiments, values obtained for measurement set (A,B,C,D) will depend on the configuration of system 1300 including the configuration of the sensing pad unit 1526, and on the specifics of the proximate object 1536, such as, but not limited to, size, shape, temperature and physical form.

Figure 18:
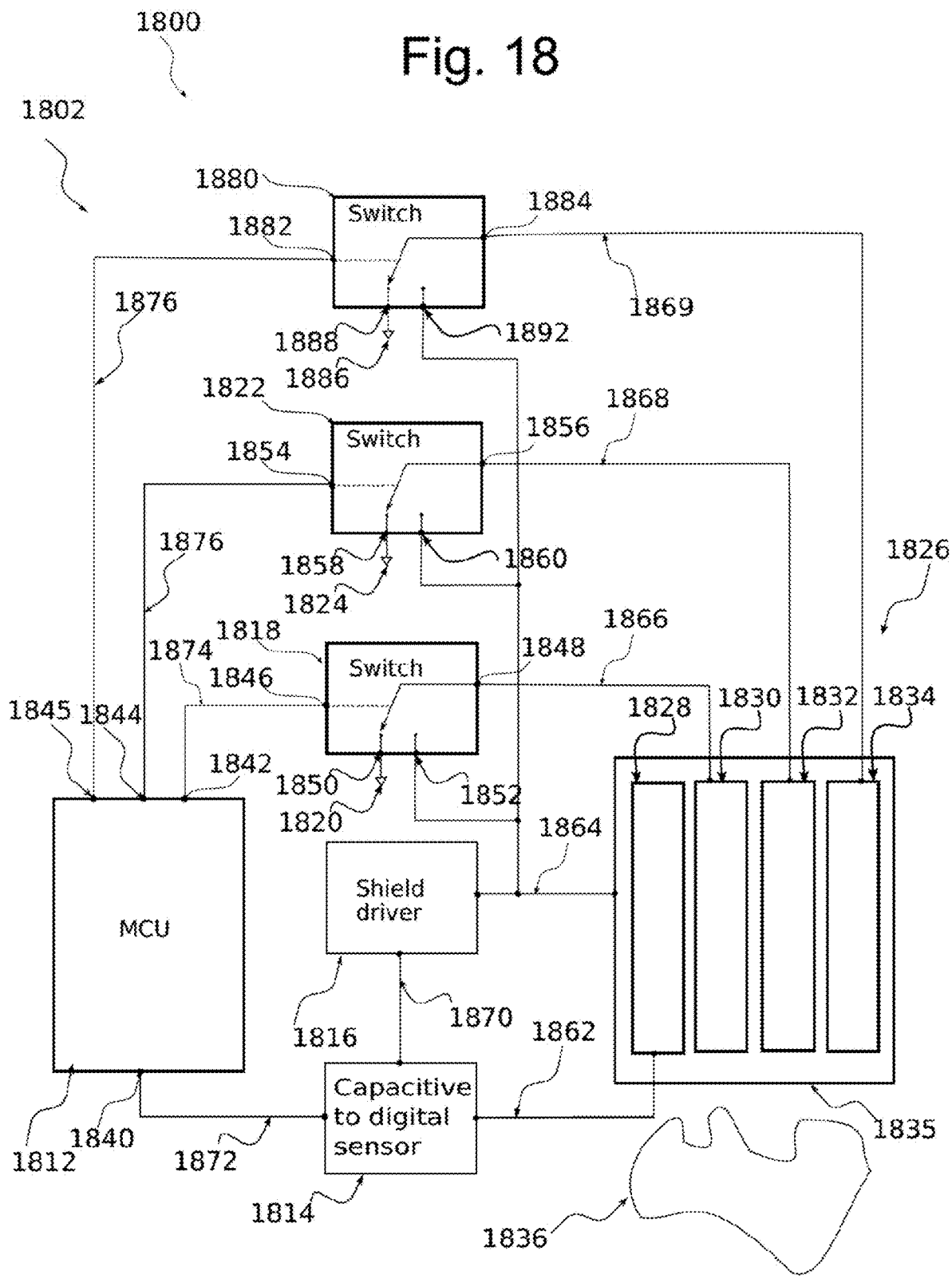
FIG. 18 illustrates an embodiment of a system which includes a sensor measurement system and a sensing pad unit.

FIG. 18 illustrates an embodiment of a system 1800 which includes a sensor measurement system 1802 and a sensing pad unit 1826. Sensor measurement system 1802 includes a control unit 1812, a capacitive to digital sensor 1814, a shield driver 1816, a single-pole double-throw switch 1818, a second single-pole double-throw switch 1822 and a third single-pole double-throw switch 1880. Sensing pad unit 1826 includes a capacitive sensing pad 1828, a proximate discriminating pad 1830, a second proximate discriminating pad 1832, a third proximate discriminating pad 1834 and a shield 1835. A proximate object or substance 1836 is illustrated in proximity to sensing pad unit 1826. The capacitive to digital sensor 1814 is connected via conductive line 1862 to the capacitive sensing pad 1828, and is connected via conductive line 1870 to the input of the shield driver 1816. The inputs 1846, 1854 and 1882 of the respective switches 1818, 1822 and 1880 are controlled by the control unit 1812. The output of the shield driver 1816 is connected to the shield pad 1835 via conductive line 1864.

In the illustrated embodiment, control unit 1812 is a micro-controller or micro-controller unit (MCU). In different embodiments, the control unit 1812 and the capacitive to digital sensor 1814 may be separate integrated circuit chips or they may be incorporated into the same integrated circuit chip. Furthermore, in different embodiments, shield driver 1816 and the capacitive to digital sensor 1814 may be separate integrated circuit chips or they may be incorporated into the same integrated circuit chip.

The control unit 1812 uses methods of digital interfacing to control the functioning of the capacitive to digital sensor 1814. If the control unit 1812 and the capacitive to digital sensor 1814 are separate physical chips then these interface methods can include, but are not limited to, $I^2C$ (also known as Inter-Integrated Circuit) and SPI (also known as Serial Peripheral Interface). In the illustrated embodiment, capacitive to digital sensor 1814 is coupled to communication interface 1840 via multiwire conductive lines 1872. The connection to communication interface 1840 can be $I^2C$ (2 wire), SPI (4 wire) or can be another suitable type of connection.

In the illustrated embodiment, the capacitance sensing pad 1828, the discriminating pads 1830, 1832 and 1834, and shield pad 1835, are constructed of conductive materials such as metals. By way of example, this can include a printed circuit board, a flex-PCB, copper tape, or conductive cloth, but can also be any other conductive substance.

In the illustrated embodiment, shield driver 1816 is electrically connected to shield pad 1835 via conductive line 1864, and shield driver 1816 drives shield pad 1835 to the same voltage potential as capacitive sensing pad 1828. Therefore, there is no electric field between the capacitive sensing pad 1828 and the shield pad 1835. Consequently, any capacitive effect of a material behind the shield pad 1835 on a capacitance measurement by capacitance to digital sensor 1814 is nullified. In usage, the shield pad 1835 is used to provide directional sensitivity to the capacitive sensing pad 1828 and to limit the capacitive effects of material behind the shield pad 1835. In the illustrated embodiment, the shield pad 1835 is placed in close proximity to the capacitive sensing pad 1828, typically a distance of a few tenths of a millimeter up to a few millimeters. In other embodiments, other suitable spacing can be used.

In various embodiments, shield pad 1835 may have a separate physical construction than the capacitive sensing pad 1828 and the discriminating pads 1830, 1832 and 1834, or shield pad 1835 can be within the substrate of capacitive sensing pad 1828, and discriminating pads 1830, 1832 and 1834, such as with a multilayer printed circuit board.

The size and shape of the capacitive sensing pad 1828 and the discriminating pads 1830, 1832 and 1834 will depend on the particular application. For example, if it is necessary that the capacitive sensing pad 1828 be sensitive to distant objects such as a proximate object or substance 1836 that is spaced apart from capacitive sensing pad 1828 by a large distance, then the capacitive sensing pad 1828 should be larger than a capacitive sensing pad 1828 designed for sensitivity to closer objects such as a proximate object or substance 1836 that is spaced apart from capacitive sensing pad 1828 by a distance that is less than the large distance.

In the illustrated embodiment, with regard to the switches 1818, 1822 and 1880, switches 1818, 1822 and 1880 may be a solid state type switch. In the illustrated embodiment, switches 1818, 1822 and 1880 are controlled via a digital interface from control unit 1812, and this interface can be an Input/Output (I/O) line set to either a digital high (H) or a digital low (L). In other embodiments, other suitable ways to control switches 1818, 1822 and 1880 may be used.

In the illustrated embodiment, the input terminal 1846 of the first switch 1818 is electrically connected to I/O terminal 1842 of the control unit 1812 via conductive line 1874. The common node 1848 of the first switch 1818 is electrically connected to the first discriminating pad 1830 via conductive line 1866. One output terminal 1850 of the first switch 1818 is connected to a ground potential at 1820, and the other output terminal 1852 is connected to the output of the shield driver 1816 via conductive line 1864. The input terminal 1854 of the second switch 1822 is electrically connected to I/O terminal 1844 of the control unit 1812 via conductive line 1876. The common node 1856 of the switch 1822 is connected to the second discriminating pad 1832 via conductive line 1868. One output terminal 1858 of the switch 1822 is connected to a ground potential at 1824, the other output terminal 1860 is connected to the output of the shield driver 1816 via conductive line 1864.

The input terminal 1882 of the third switch 1880 is electrically connected to I/O terminal 1845 of the control unit 1812 via conductive line 1876. The common node 1884 of the third switch 1880 is connected to the third discriminating pad 1834 via conductive line 1869. One output terminal 1888 of the third switch 1880 is connected to a ground potential at 1886, the other output terminal 1892 is connected to the output of the shield driver 1816 via conductive line 1864.

The switches 1818, 1822 and 1880 are controlled by control unit 1812 and control unit 1812, and control unit 1812 can set the input terminals 1846, 1854 and 1882 of respective switches 1818, 1822 and 1880, to the appropriate value of H or L. It is understood that the specifics of this will depend on the chosen implementation of the switches 1818, 1822 and 1880, and that the order of the switching is not important to the method.

If we write in shorthand {X,Y,Z} where X, Y and Z represent the connection state of the first switch 1818, the second switch 1822 and the third switch 1880, respectively, where the connection state can take the values of either "S" or "G" which represent the state when the first switch 1818, the second switch 1822 and the third switch 1880 connect respectively the first discriminating pad 1830, the second discriminating pad 1832 or the third discriminating pad 1834 to either the output of the shield driver 1816 via conductive line 1864 ("S"), or to respective ground connections 1820, 1824 and 1886 ("G"). Then the possible measurement configurations can be written as: measurement A: {S, S, S}; measurement B: {G, G, G}; measurement C: {S, G, G}; measurement D: {S, S, G}; measurement E: {S, G, S}; measurement F: {G, S, G}; measurement G: {G, G, S}; measurement H: {G, S, S}. At the end of a single measurement cycle, there will be 8 capacitive measurements corresponding to all possible configurations of the discriminating pad connections. The capacitive measurements at the end of the single measurement cycle will be hereafter referred to as a "measurement set" (e.g., capacitive measurement set (A,B,C,D,E,F,G,H)).

In the illustrated embodiment, switching discriminating pads 1830, 1832 and 1834 between respective ground connections 1820, 1824 and 1886 and the output of shield driver 1816 via conductive line 1864 results in a change in the electric field lines between the capacitive sensing pad 1828 and the proximate object 1836, resulting in 8 different capacitive measurements. The degree to which these measurements change will also be dependent on the type of substance or object, its shape, and its distance from the sensing pad unit. Consequently, these measurements may be used to distinguish between and/or identify different objects or substances 1836, or may be used to determine the properties of the object or substance 1836.

In the illustrated embodiment, to determine the relationship between the proximate object 1836 and the capacitive measurements, a set of sample measurements for each of a range of objects and substances that are of interest are taken and the sample set of measurement sets are analyzed using data analysis techniques. In the illustrated embodiment, the application of one or more methods of Machine Learning or numerical optimization can be used. These methods include, but are not limited to, Neural Networks, Decision Trees and its variants, Nearest Neighbor algorithms, or Linear Discriminant Analysis, evolutionary search, genetic algorithms, high dimensional splines, and linear and non-linear optimization. In other embodiments, visual inspection of the set of sample measurements can be used.

As there may be a non-negligible background capacitance that exists even when there is no proximate object 1836, for example due to parasitic capacitance in the sensing pad unit 1826, or to the capacitive effects of the physical installation of the sensor system 1800, it may be necessary to perform a baseline measurement of this background capacitance for each configuration of the discriminating pads, and then use these values to remove the background reading from further measurements. Consequently there will be 8 baseline values. These baseline values correspond to measurement configurations which are: measurement A: {S, S, S}; measurement B: {G, G, G}; measurement C: {S, G, G}; measurement D: {S, S, G}; measurement E: {S, G, S}; measurement F: {G, S, G}; measurement G: {G, G, S}; measurement H: {G, S, S}. Typical methods of establishing a baseline are to compute the mean or the median of a set of measurements taken in the absence of a proximate object.

Figure 19:
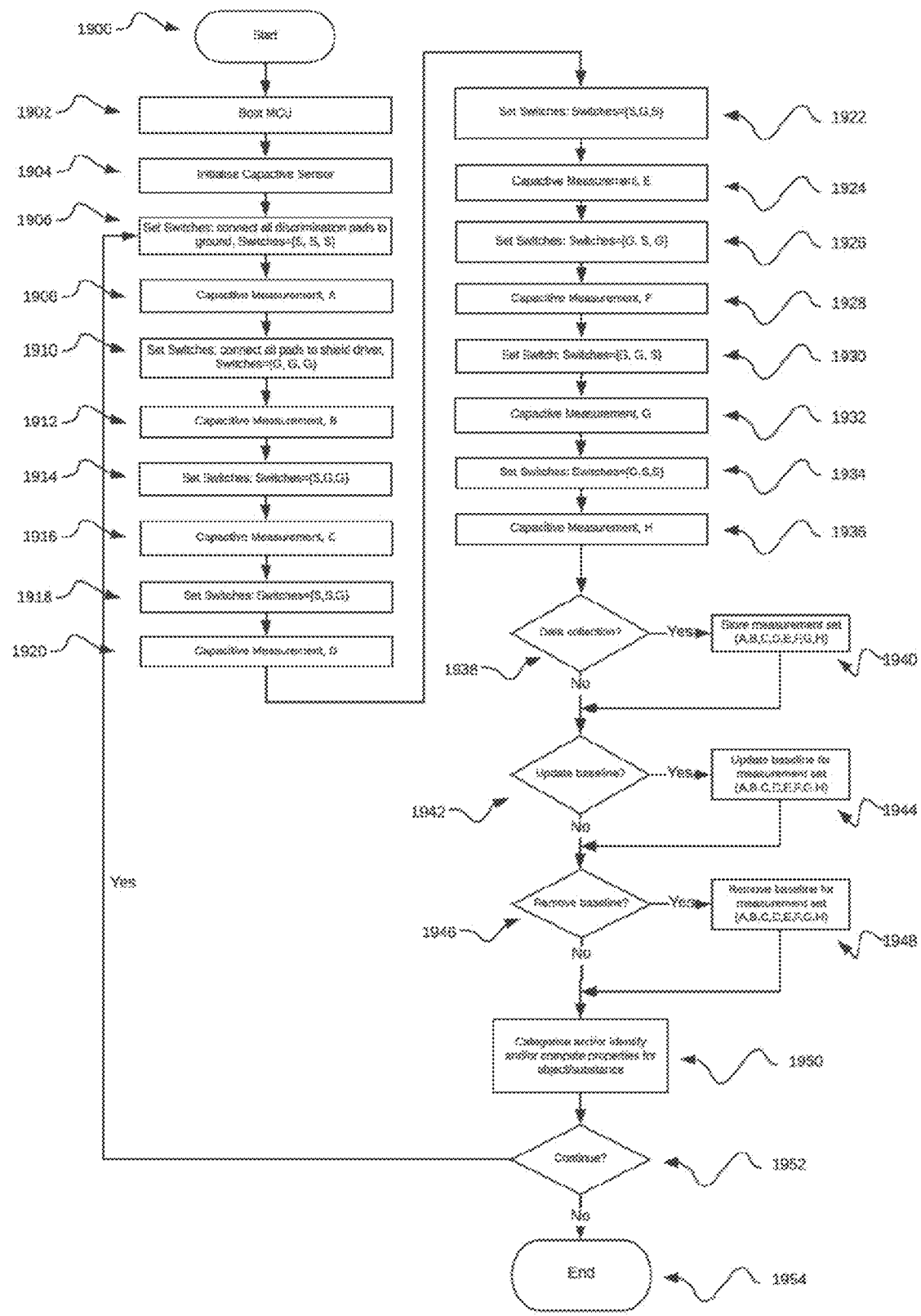
FIG. 19 illustrates a flow chart of an embodiment of a measurement process.

FIG. 19 illustrates a flow chart of an embodiment of a measurement process. On startup 1900, the control unit 1812 performs its initialization process 1902. The capacitive to digital sensor 1814 performs its initialization process 1904 with the measurement parameters set by the control unit 1812. These parameters are specific to each capacitive sensor but may include parameters like measurement rate, channel number, method of offset, and accuracy. The first switch 1818, the second switch 1822 and the third switch 1880 are set to state {S,S,S} at 1906. A capacitive measurement, A, is made at 1908. The first switch 1818, the second switch 1822 and the third switch 1880 are set to state {G,G,G} at 1910. A capacitive measurement, B, is made 1912. The first switch 1818, the second switch 1822 and the third switch 1880 are set to state {S,G,G} at 1914. A capacitive measurement, C, is made at 1916. The first switch 1818, the second switch 1822 and the third switch 1880 are set to state {S,S,G} at 1918. A capacitive measurement, D, is made at 1920. The first switch 1818, the second switch 1822 and the third switch 1880 are set to state {S,G,S} at 1922. A capacitive measurement, E, is made at 1924. The first switch 1818, the second switch 1822 and the third switch 1880 are set to state {G,S,G} at 1926. A capacitive measurement, F, is made at 1928. The first switch 1818, the second switch 1822 and the third switch 1880 are set to state {G,G,S} at 1930. A capacitive measurement, G, is made at 1932. The first switch 1818, the second switch 1822 and the third switch 1880 are set to state {G,S,S} at 1934. A capacitive measurement, H, is made at 1936.

If these measurement are part of a data collection process at 1938, such as to be used as sample data for a Machine Learning analysis, then the data is stored at 1940 for later transfer to a memory device.

If these measurements are part of a baseline process at 1942, then the baseline is calculated and updated at 1944. If the baseline is to be removed from the measurement at 1946, then the baseline is removed at 1948. If categorization or identification of the object or material is required, or if the computation of material properties is required, then the categorization/computational process is implemented at 1950. If the process continues at 1952, then the process returns to the switch process settings at 1906, otherwise the process halts at 1954.

Figure 20A:
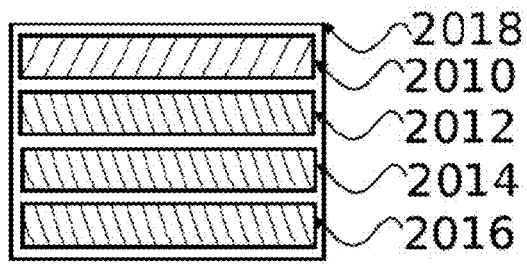
FIGS. 20A-20E illustrate top views of embodiments of a sensing pad unit.

FIGS. 20A-20E illustrate plan or top views of embodiments of a sensing pad unit. FIG. 20A illustrates a plan view of a substantially rectangular capacitive sensing pad 2010, with a substantially rectangular discriminating pad 2012 in nearby proximity, a second substantially rectangular discriminating pad 2014 in nearby proximity, a third substantially rectangular discriminating pad 2016 in nearby proximity, and a shield pad 2018 underneath. This configuration of capacitive pad and discriminating pad is asymmetrical.

Figure 20B:
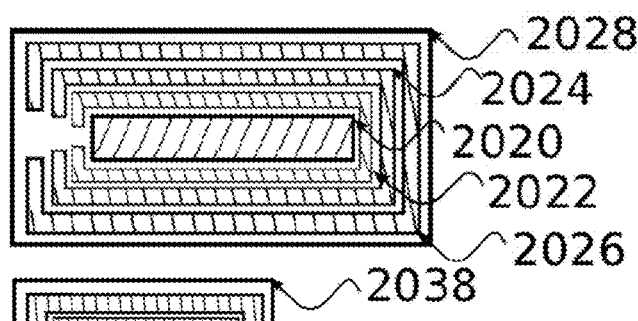

FIG. 20B illustrates a plan view of a symmetrical arrangement, comprising a substantially rectangular capacitive sensing pad 2020, a first discriminating pad 2022 substantially surrounding the capacitive sensing pad 2020, a second discriminating pad 2024 substantially surrounding the capacitive sensing pad 2020 and the first discriminating pad 2022, a third discriminating pad 2026 substantially surrounding the capacitive sensing pad 2020, the first discriminating pad 2022 and the second discriminating pad 2024, and a shield pad 2028 underneath the capacitive sensing pad 2020, the first discriminating pad 2022, the second discriminating pad 2024 and the third discriminating pad 2026. In the illustrated embodiment, shield pad 2026, underneath the capacitive sensing pad 2020, reduces the sensitivity of capacitance measurements made using the capacitive sensing pad 2020 to capacitance effects caused by material behind the shield pad 306.

Figure 20C:
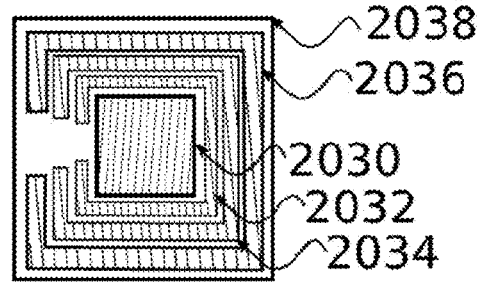

FIG. 20C illustrates a plan view of a symmetrical arrangement, comprising a substantially rectangular capacitive sensing pad 2030, a first discriminating pad 2032 substantially surrounding the capacitive sensing pad 2030, a second discriminating pad 2034 substantially surrounding the capacitive sensing pad 2030 and the first discriminating pad 2032, a third discriminating pad 2036 substantially surrounding the capacitive sensing pad 2030, the first discriminating pad 2032 and the second discriminating pad 2034, and a shield pad 2038 underneath the capacitive sensing pad 2030, first discriminating pad 2032, second discriminating pad 2034 and third discriminating pad 2036. In the illustrated embodiment, shield pad 2038, underneath the capacitive sensing pad 2030, reduces the sensitivity of capacitance measurements made using the capacitive sensing pad 2030 to capacitance effects caused by material behind the shield pad 2036.

Figure 20D:
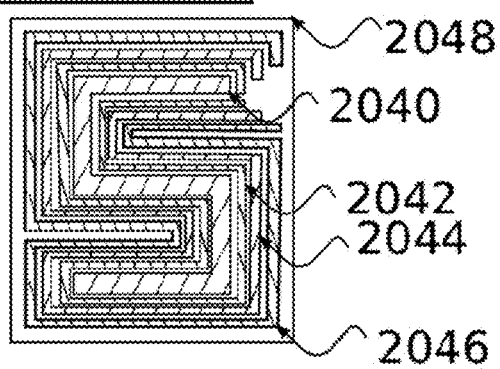

FIG. 20D illustrates a plan view of an "S" shaped arrangement, comprising an S-shaped capacitive sensing pad 2040, a first discriminating pad 2042 substantially surrounding the capacitive sensing pad 2040, a second discriminating pad 2044 substantially surrounding the capacitive sensing pad 2040 and the first discriminating pad 2042, a third discriminating pad 2046 substantially surrounding the capacitive sensing pad 2040, the first discriminating pad 2042 and the second discriminating pad 2044, and a shield pad 2046 underneath the capacitive sensing pad 2040, first discriminating pad 2042, second discriminating pad 2044 and third discriminating pad 2046. In the illustrated embodiment, shield pad 2048, underneath the capacitive sensing pad 2040, reduces the sensitivity of capacitance measurements made using the capacitive sensing pad 2040 to capacitance effects caused by material behind the shield pad 2048.

Figure 20E:
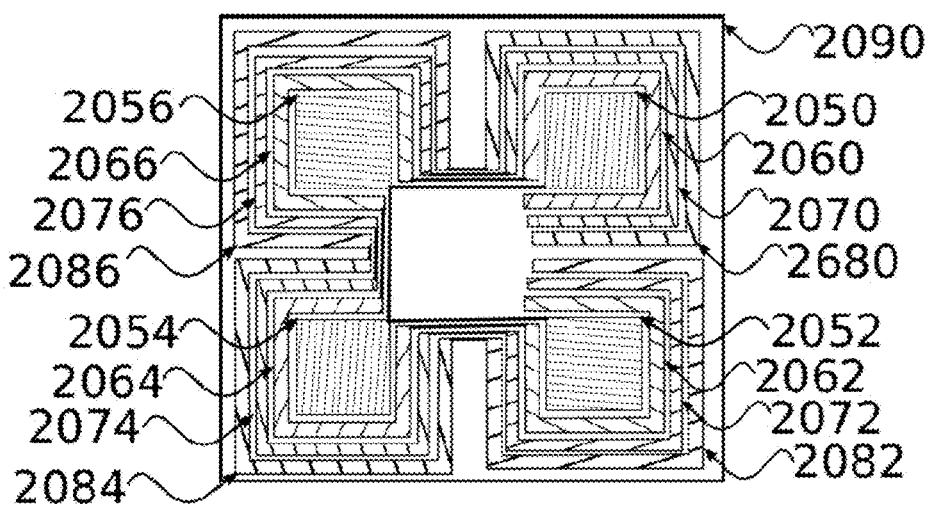

FIG. 20E illustrates a plan view of a grid of four substantially square capacitive sensing pads 2050, 2052, 2054 and 2056, each substantially surrounded by a respective first discriminating pad 2060, 2062, 2064 and 2066, a respective second discriminating pad 2070, 2072, 2074 and 2076, a respective third discriminating pad 2080, 2082, 2084 and 2086, and a shield pad 2090 underneath the capacitive sensing pads 2050, 2052, 2054 and 2056, the first discriminating pad 2060, 2062, 2064 and 2066, the second discriminating pad 2070, 2072, 2074 and 2076, and the respective third discriminating pad 2080, 2082, 2084 and 2086. The capacitive sensing pad 2050 and its surrounding discriminating pads 2060, 2070 and 2080 comprise a first sub unit. The capacitive sensing pad 2052 and its surrounding discriminating pads 2062, 2072 and 2082 comprise a second sub unit. The capacitive sensing pad 2054 and its surrounding discriminating pads 2064, 2074 and 2084 comprise a third sub unit. The capacitive sensing pad 2056 and its surrounding discriminating pads 2066, 2076 and 2086 comprise a fourth sub unit.

FIG. 21 illustrates a plot of embodiments of capacitive measurements (G-H) vs (A-D) for a variety of objects and substances. The data points illustrated in FIG. 21 were obtained using the capacitive sensing pad unit illustrated in FIG. 16C, the sensor measurement system 1802 illustrated in FIG. 18, and the measurement method illustrated in FIG. 19. The measurement method illustrated in FIG. 19 was used to obtain capacitive measurements sets (A,B,C,D,E,F,G,H). Of these measurement sets, the measurement sets (A,D,G,H) were used for FIG. 21. The vertical y-axis illustrates measurement G minus measurement H (e.g., measurement H subtracted from measurement G), and the horizontal x-axis illustrates measurement A minus measurement D (e.g., measurement D subtracted from measurement A). The objects and materials tested were rice, bottles of water of various quantities, aluminum granules, mobile phones of various quantities, book of various quantities, lead granules and wheat. For rice, aluminum granules, lead granules and wheat, the quantities measured were increased in centiliter (cl) units from 4 cl to 40 cl. FIG. 21 illustrates a separation between different materials and different object types. The separations depends on the composition, size, shape and quantity of the material/object. Other classes of objects and other materials will occupy other areas in a plot of (G-H) vs (A-D). In other embodiments and in plots of other combinations of capacitive measurements such as (AB) vs (G/H), the form of separation in the plot may be different. FIG. 21 illustrates a separation in an increasing vertical direction of the y-axis between lead granules (bottom), aluminum granules, rice and wheat (top). FIG. 21 further illustrates a separation in an increasing horizontal direction of the x-axis between wheat (first), rice (second), aluminum granules (third) and lead granules (fourth) based on quantity. In the embodiments illustrated herein, these separations enable identification of both the quantity of material and the type of material.

In the illustrated embodiment, the dimensions of the capacitive sensing pad 2030 are 2 cm on a side, the width of the first discriminating pad 2032 was 5 mm, and the separation between the capacitive sensing pad 2030 and the first discriminating pad 2032 was 1 mm. The width of the second discriminating pad 2034 was 14 mm, and the separation between the first discriminating pad 2032 and the second discriminating pad 2034 was 1 mm. The width of the third discriminating pad 2036 was 14 mm, and the separation between the first discriminating pad 2032 and the second discriminating pad 2034 was 1 mm.

In other embodiments, measurements A and B of measurement set (A,B,C,D,E,F,G,H) can be combined in a variety of suitable ways to obtain optimal separation of the desired substances. In various embodiments, values obtained for measurement set (A,B,C,D,E,F,G,H) will depend on the configuration of system 1800 including the configuration of the sensing pad unit 1826, and on the specifics of the proximate object 1586, such as, but not limited to, size, shape, temperature and physical form.

With the embodiments and sensing pad unit configurations illustrated herein, the conductive elements of the sensing pad unit are kept electrically isolated from the surrounding environment, including when immersed in, or in contact with, objects or substances. Forms of electrical isolation may include, but are not limited to, a layer of air or a protective non-conductive coating.

With the embodiments and sensing pad unit configurations illustrated herein, the ground connections 120 and 124 may be replaced by a fixed voltage reference potential of between 0 volts and V+ where V+ is the digital power supply voltage. In these embodiments, the digital power supply voltage provides power to controller 112.

With all embodiments, the ground may be connected to earth.

With all embodiments and sensing pad unit configurations, the shield pad may not be an absolute requirement but usage may depend on whether a symmetric directional sensitivity of the capacitive sensing pad is desired, or limited asymmetry in the directional sensitivity of the capacitive sensing pad is desired.

With all embodiments and sensing pad unit configurations, a ground plane may be added beneath the sensing pad unit.

The advantages of the present invention include, without limitation, the ability to identify, and/or discriminate between, different substances and different objects. These substances may be liquids, or they may be solids, or they may be pourable solids such as granulated or crystalline substances. Objects may be discrete items such as, but not limited to, humans, animals, and items of clothing, mobiles phones, books, newspapers, laptop computers and bottles of liquid. Objects may be parts of other objects such as parts of a human body, for example hands or fingers.

Applications for a discriminating capacitive sensor include, but are not limited to, seat occupancy in cars and public transport, process control, industrial automation, fuel sensors, robotics.

Applications for a capacitive sensor that measures material properties include, but are not limited to, process control, industrial automation, level sensors, purity sensors, temperature sensors and robotics.

In broad embodiment, the present invention is capacitive sensor which has at least one discriminating pad that can be switched between connections to ground and or a shield driver and that can identify and/or discriminate between different objects and substances, and can measure intrinsic electromagnetic properties such as Dielectric Constant and Dipole Moment.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention.

The detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. For purposes of description herein, the terms "upper", "lower", "left", "rear", "right", "front", "vertical", "horizontal", and derivatives thereof shall relate to the invention as oriented in the figures. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A capacitive sensor system for detecting an object, comprising:
   a capacitive sensing pad;
   a conductive discriminating pad in proximity to the capacitive sensing pad;
   a switch having an input terminal coupled to the discriminating pad, the switch selectively coupling the discriminating pad to a voltage potential of the capacitive sensing pad or to a ground potential;
   a capacitance measurement circuit that detects a capacitance value of the capacitive sensing pad; and
   a controller operable to measure the capacitance value of the capacitive sensing pad when the discriminating pad is coupled to the capacitive sensing pad voltage potential and when the discriminating pad is coupled to the ground potential.

2. The capacitive sensor system of claim 1, wherein the discriminating pad is coplanar with and adjacent to a boundary of the capacitive sensing pad, and wherein the discriminating pad is conductive and includes one or more line or curve segments that are electrically coupled together.

3. The capacitive sensor system of claim 2, further comprising
   at least one additional discriminating pad that is coplanar with the capacitive sensing pad, wherein each one of the at least one additional discriminating pad is conductive and includes one or more line or curve segments that are electrically coupled together, and wherein each one of the at least one additional discriminating pad is separated from an adjacent interior one of either the discriminating pad or one of the at least one additional discriminating pad by a distance that is less than the width of the at least one additional discriminating pad; and
   at least one additional switch that includes an input terminal coupled to a corresponding at least one additional discriminating pad and operable to couple the corresponding at least one additional discriminating pad to the capacitive sensing pad voltage potential or to the ground potential.

4. The capacitive sensor system of claim 2, further comprising a conductive shield pad arranged to be parallel with and under the capacitive sensing pad, wherein the shield pad is separated from the capacitive sensing pad by a distance that is less than the minimum dimension of the capacitive sensing pad.

5. The capacitive sensor system of claim 4, further comprising a shield driver that provides the capacitive sensing pad voltage potential at an output to the shield pad, wherein the switch has a first output terminal connected to the ground potential and a second output terminal coupled to the output of the shield driver.

6. The capacitive sensor system of claim 2, wherein the capacitive sensing pad has a rectangular shape.

7. The capacitive sensor system of claim 2, wherein the capacitive sensing pad comprises a polyline of line segments, and wherein the one or more line or curve segments of the discrimination pad substantially surround the polyline of line segments.

8. The capacitive sensor system of claim 1, wherein the capacitive sensing pad comprises a grid of two or more capacitive sensing pads, wherein the one or more line or curve segments of the discriminating pad substantially surrounds a boundary of each one of the two or more capacitive sensing pads.

9. A method of identifying an object or substance, comprising:
   providing a capacitive sensing pad and n conductive discriminating pads where $n \geq 1$;
   providing a shield driver that provides a voltage potential of the capacitive sensing pad;
   providing n switches that each have an input terminal coupled to one of the n discriminating pads and have two switch connection states which selectively couple the input terminal to the capacitive sensing pad voltage potential or to the ground potential, wherein the n switches are operable to provide $2^{nd}$ unique connection states for the n discriminating pads;
   placing the object in proximity to the capacitive sensing pad;
   measuring up to $2^{nd}$ capacitance values of the capacitive sensing pad that each correspond to one of the $2^n$ unique connection states for the n discriminating pads;
   determining a capacitance value for the object or substance by comparing a first set of the $2^n$ capacitance values and a second set of the $2^n$ capacitance values; and
   identifying the object or substance by comparing the capacitance value to one or more reference capacitance values for reference objects or substances having the same and/or different material properties as the object or substance.

10. The method of claim 9, wherein determining a capacitance value for the object or substance comprises the first set of the $2^n$ capacitance values being one of the up to $2^n$ capacitance values or a sum or difference between two of the up to $2^n$ capacitance values, and the second set of the $2^n$ capacitance values being a different one of the up to $2^n$ capacitance values or a sum or difference between a different two of the up to $2^n$ capacitance values.

11. The method of claim 9, wherein identifying the object or substance further comprises:
    measuring the one or more reference capacitance values for the one or more reference objects or substances using the same $2^n$ unique connection states used for the first set of the $2^n$ capacitance values and the second set of the $2^n$ capacitance values; and
    comparing the capacitance value to the reference capacitance value to identify the object or substance.

12. The method of claim 9, wherein identifying the object or substance further comprises:
    measuring the one or more reference capacitance values for each one of two or more reference objects or substances using the same $2^n$ unique connection states used for the first set of the $2^n$ capacitance values and the second set of the $2^n$ capacitance values;
    comparing the one or more reference capacitance values for each one of the two or more reference objects to identify a separation between the one or more reference capacitance values for one of the two or more reference objects and the one or more reference capacitance values for another one of the two or more reference objects; and
    comparing the capacitance value to the one or more reference capacitance values for each one of the two or more reference objects to identify the object or substance.

13. The method of claim 9, further comprising:
    before placing the object in proximity to the capacitive sensing pad, measuring baseline capacitance values using the same $2^n$ unique connection states used for the first set of the $2^n$ capacitance values and the second set of the $2^n$ capacitance values; and
    before identifying the object or substance, removing the baseline capacitance values from the first set of the $2^n$ capacitance values and the second set of the $2^n$ capacitance values.

14. A method of identifying an object or substance, comprising:
    providing a capacitive sensing pad and n conductive discriminating pads where n≥1;
    providing a shield driver that provides a voltage potential of the capacitive sensing pad;
    providing n switches that each have an input terminal coupled to one of the n discriminating pads and have two switch connection states which selectively couple the input terminal to the capacitive sensing pad voltage potential or to the ground potential, wherein the n switches are operable to provide $2^n$ unique connection states for the n discriminating pads;
    placing the object or substance in proximity to the capacitive sensing pad; and
    taking capacitive measurement sets of the object or substance, each measurement set corresponding to $2^n$ capacitance values measured using the capacitive sensing pad for the $2^n$ unique connection states for the n discriminating pads;
    determining a mathematical relationship between the capacitive measurement sets and known dielectric constants or dipole moments of the object or substance;
    identifying the object or substance based on the mathematical relationship and the known dielectric constants or dipole moments of the object or substance.

* * * * *